(12) United States Patent
Kobayashi et al.

(10) Patent No.: US 8,633,485 B2
(45) Date of Patent: Jan. 21, 2014

(54) DISPLAY DEVICE AND MANUFACTURING METHOD THEREOF

(75) Inventors: Satoshi Kobayashi, Atsugi (JP);
Yoshiyuki Kurokawa, Sagamihara (JP);
Shunpei Yamazaki, Setagaya (JP);
Daisuke Kawae, Atsugi (JP)

(73) Assignee: Semiconductor Energy Laboratory Co., Ltd., Atsugi-shi, Kanagawa (JP)

( * ) Notice: Subject to any disclaimer, the term of this patent is extended or adjusted under 35 U.S.C. 154(b) by 0 days.

(21) Appl. No.: 13/075,436

(22) Filed: Mar. 30, 2011

(65) Prior Publication Data
US 2011/0175091 A1 Jul. 21, 2011

Related U.S. Application Data

(62) Division of application No. 12/222,256, filed on Aug. 6, 2008, now Pat. No. 7,968,885.

(30) Foreign Application Priority Data

Aug. 7, 2007 (JP) ................................ 2007-205694

(51) Int. Cl.
*H01L 31/00* (2006.01)
*H01L 29/10* (2006.01)
*H01L 29/76* (2006.01)
*H01L 31/036* (2006.01)
*H01L 31/112* (2006.01)
*H01L 21/02* (2006.01)

(52) U.S. Cl.
USPC .................. 257/59; 257/57; 257/66; 257/346

(58) Field of Classification Search
None
See application file for complete search history.

(56) References Cited

U.S. PATENT DOCUMENTS

| 4,409,134 A | 10/1983 | Yamazaki | |
| 4,937,640 A * | 6/1990 | Fang et al. | 257/346 |

(Continued)

FOREIGN PATENT DOCUMENTS

| EP | 0 473 988 | 3/1992 |
| JP | 60-098680 | 6/1985 |

(Continued)

OTHER PUBLICATIONS

Arai et al., "41.2: Micro Silicon Technology for Active Matrix OLED Display," SID Digest '07: SID International Symposium Digest of Technical Papers, 2007, vol. XXXVIII, pp. 1370-1373.

(Continued)

*Primary Examiner* — Fernando L Toledo
*Assistant Examiner* — Valerie N Newton
(74) *Attorney, Agent, or Firm* — Eric J. Robinson; Robinson Intellectual Property Law Office, P.C.

(57) ABSTRACT

To provide a display device having a thin film transistor with high electric characteristics and excellent reliability and a manufacturing method thereof. A gate electrode, a gate insulating film provided over the gate electrode, a first semiconductor layer provided over the gate insulating film and having a microcrystalline semiconductor, a second semiconductor layer provided over the first semiconductor layer and having an amorphous semiconductor, and a source region and a drain region provided over the second semiconductor layer are provided. The first semiconductor layer has high crystallinity than the second semiconductor layer. The second semiconductor layer includes an impurity region having a conductivity type different from a conductivity type of the source region and the drain region between the source region and the drain region.

24 Claims, 20 Drawing Sheets

(56) References Cited

U.S. PATENT DOCUMENTS

| | | |
|---|---|---|
| 5,256,509 A | 10/1993 | Hayashi et al. |
| 5,453,858 A | 9/1995 | Yamazaki |
| 5,591,987 A | 1/1997 | Yamazaki et al. |
| 5,648,662 A | 7/1997 | Zhang et al. |
| 5,701,167 A | 12/1997 | Yamazaki |
| 5,766,989 A | 6/1998 | Maegawa et al. |
| 5,811,328 A | 9/1998 | Zhang et al. |
| 5,825,050 A | 10/1998 | Hirakawa |
| 5,849,601 A | 12/1998 | Yamazaki |
| 6,023,075 A | 2/2000 | Yamazaki |
| 6,124,155 A | 9/2000 | Zhang et al. |
| 6,166,399 A | 12/2000 | Zhang et al. |
| 6,252,249 B1 | 6/2001 | Yamazaki |
| 6,268,235 B1 | 7/2001 | Sakakura et al. |
| 6,306,213 B1 | 10/2001 | Yamazaki |
| 6,335,213 B1 | 1/2002 | Zhang et al. |
| 6,750,087 B2 | 6/2004 | Morita et al. |
| 6,756,258 B2 | 6/2004 | Zhang et al. |
| 6,797,548 B2 | 9/2004 | Zhang et al. |
| 6,847,064 B2 | 1/2005 | Zhang et al. |
| 7,067,844 B2 | 6/2006 | Yamazaki |
| 7,098,479 B1 | 8/2006 | Yamazaki |
| 7,115,448 B2 | 10/2006 | Tsujimura et al. |
| 7,115,902 B1 | 10/2006 | Yamazaki |
| 7,148,542 B2 | 12/2006 | Yamazaki et al. |
| 7,507,991 B2 | 3/2009 | Zhang et al. |
| 7,576,360 B2 | 8/2009 | Yamazaki |
| 7,718,463 B2 | 5/2010 | Yamazaki et al. |
| 2004/0188685 A1* | 9/2004 | Lin et al. ............... 257/66 |
| 2005/0012097 A1* | 1/2005 | Yamazaki ............... 257/59 |
| 2008/0044962 A1 | 2/2008 | Zhang et al. |

FOREIGN PATENT DOCUMENTS

| | | |
|---|---|---|
| JP | 61-087371 | 5/1986 |
| JP | 01-102968 A | 4/1989 |
| JP | 04-242724 | 8/1992 |
| JP | 04-367276 A | 12/1992 |
| JP | 06-077483 | 3/1994 |
| JP | 06-326312 A | 11/1994 |
| JP | 11-121761 | 4/1999 |
| JP | 2001-007024 | 1/2001 |
| JP | 2001-127296 | 5/2001 |
| JP | 2001-228477 A | 8/2001 |
| JP | 2002-246605 | 8/2002 |
| JP | 2003-297850 A | 10/2003 |
| JP | 2004-304140 A | 10/2004 |
| JP | 2005-049832 | 2/2005 |
| JP | 2005-167051 | 6/2005 |
| JP | 2007-005508 | 1/2007 |
| JP | 2007-035964 | 2/2007 |
| JP | 2007-049171 | 2/2007 |

OTHER PUBLICATIONS

Lee et al., "High-Mobility Nanocrystalline Silicon Thin-Film Transistors Fabricated by Plasma-Enhanced Chemical Vapor Deposition," Appl. Phys. Lett. (Applied Physics Letters), May 24, 2005, vol. 86, pp. 222106-1-222106-3.

Lee et al., "High-Mobility N-Channel and P-Channel Nanocrystalline Silicon Thin-Film Transistors," IEDM 05: Technical Digest of International Electron Devices Meeting, 2005, pp. 937-940.

Lee et al., "Directly Deposited Nanocrystalline Silicon Thin-Film Transistors With Ultra High Mobilities," Appl. Phys. Lett. (Applied Physics Letters), Dec. 18, 2006, vol. 89, pp. 252101-1-252101-3.

Lee et al., "How to Achieve High Mobility Thin Film Transistors by Direct Deposition of Silicon Using 13.56 MHZ RF PECVD?," IEDM, 2006, pp. 295-298.

Esmaeili-Rad et al., "High Stability, Low Leakage Nanocrystalline Silicon Bottom Gate Thin Film Transistors for Amoled Displays," IEEE IEDM, 2006, pp. 303-306.

Lee et al., "Leakage Current Mechanisms in Top-Gate Nanocrystalline Silicon Thin-Film Transistors," Appl. Phys. Lett. (Applied Physics Letters), Feb. 28, 2008, vol. 92, pp. 083509-1-083509-3.

Esmaeili-Rad et al., "Absence of Defect State Creation in Nanocrystalline Silicon Thin-Film Transistors Deduced From Constant Current Stress Measurements," Appl. Phys. (Applied Physics Letters), Sep. 12, 2007, vol. 91, pp. 113511-1-113511-3.

Lee et al., "Stability of NC-SI:H TFTS With Silicon Nitride Gate Dielectric," IEEE Transactions on Electron Devices, 2007, vol. 54, No. 1, pp. 45-51.

Sazonov et al., "Low-Temperature Materials and Thin Film Transistors for Flexible Electronics," Proceedings of the IEEE, Aug. 1, 2005, vol. 93, No. 8, pp. 1420-1428.

Esmaeili-Rad et al., "Stability of Nanocrystalline Silicon Bottom-Gate Thin-Film Transistors With Silicon Nitride Gate Dielectric," J. Appl. Phys. (Journal of Applied Physics), Sep. 28, 2007, vol. 102, pp. 064512-1-064512-7.

Lee et al., "Top-Gate TFTS Using 13.56MHZ PECVD Microcrystalline Silicon," IEEE Electron Device Letters, Sep. 5, 2005, vol. 26, No. 9, pp. 637-639.

Lee et al., "Postdeposition Thermal Annealing and Material Stability of 75°C Hydrogenated Nanocrystalline Silicon Plasma-Enhanced Chemical Vapor Deposition Films," J. Appl. Phys. (Journal of Applied Physics), Aug. 4, 2005, vol. 98, pp. 034305-1-034305-7.

* cited by examiner

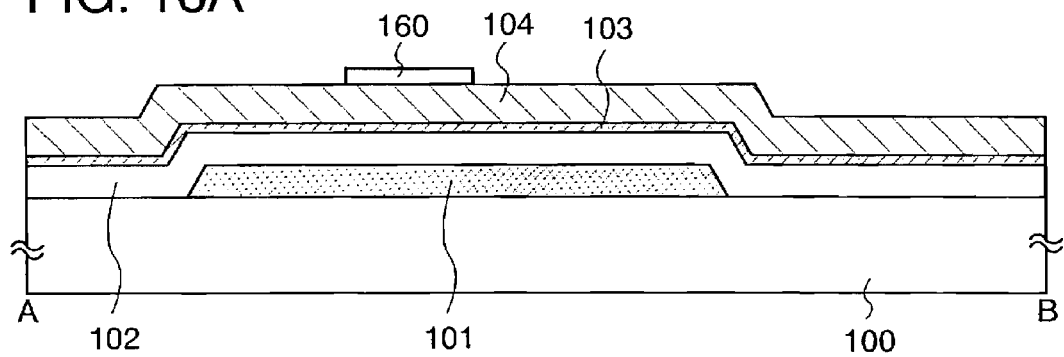
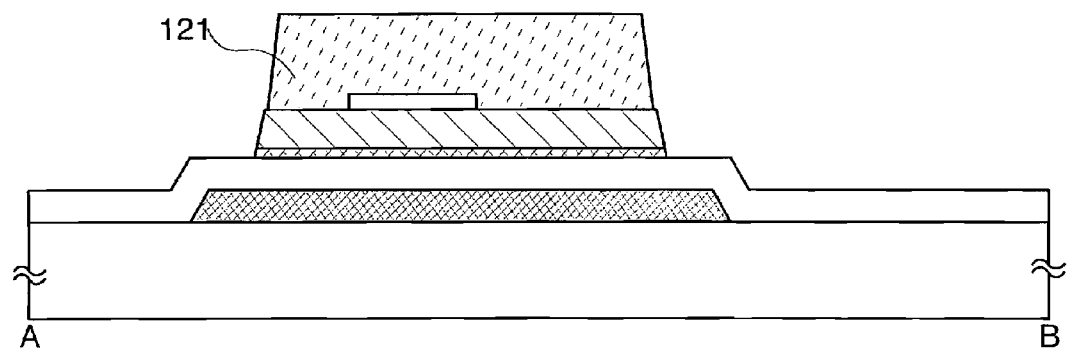
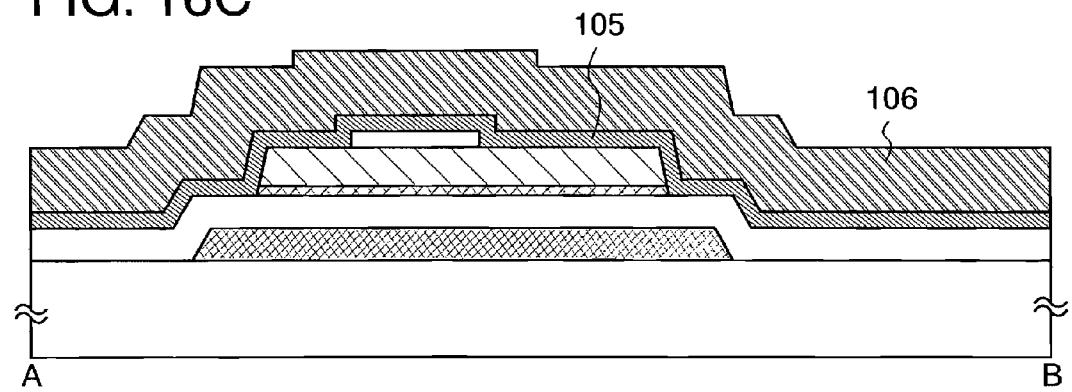

DISPLAY DEVICE AND MANUFACTURING METHOD THEREOF

BACKGROUND OF THE INVENTION

1. Field of the Invention

The present invention relates to a display device and a manufacturing method thereof. In particular, the present invention relates to a display device in which a thin film transistor is used for a pixel portion and a manufacturing method thereof.

2. Description of the Related Art

In recent years, a technique for forming a thin film transistor (TFT) by using a semiconductor thin film (having a thickness of approximately several to several hundreds of nanometers) formed over a substrate having an insulating surface has attracted attention. Thin film transistors have been widely applied to electronic devices such as ICs and electro-optical devices and have been rapidly developed particularly as switching elements for image display devices.

A thin film transistor using an amorphous semiconductor film or a thin film transistor using a polycrystalline semiconductor film is mainly used as a switching element of an image display device. As a method for forming a polycrystalline semiconductor film, a technique is known in which a pulsed excimer laser beam is processed linearly by an optical system and an amorphous semiconductor film is irradiated with a linear laser beam while being scanned by the linear laser beam to be crystallized.

A thin film transistor using a polycrystalline semiconductor film has advantages that it has higher mobility than a thin film transistor using an amorphous semiconductor film by two or more digits, and that a pixel portion of a display device and a peripheral driver circuit thereof can be formed over the same substrate. However, because of crystallization of a semiconductor film, steps of a thin film transistor using a polycrystalline semiconductor become more complicated than steps of a thin film transistor using an amorphous semiconductor film. Therefore, there is a problem in that yield is reduced and cost is increased.

In addition, a thin film transistor using a microcrystalline semiconductor film is used as a switching element which has higher mobility than an amorphous semiconductor film and facilitates manufacturing steps (see Reference 1: Japanese Published Patent Application No. H04-242724, Reference 2: Japanese Published Patent Application No. 2005-49832, and Reference 3: U.S. Pat. No. 5,591,987).

As a method for manufacturing a thin film transistor using a microcrystalline semiconductor, a method is known in which an amorphous silicon film is formed over a gate insulating film, a metal film is formed over the amorphous silicon film, and the metal film is irradiated with diode laser to modify the amorphous silicon film into a microcrystalline silicon film (for example, see Reference 4: Toshiaki ARAI and others, SID '07 DIGEST, 2007, pp. 1370 to 1373). With this method, the metal film formed over the amorphous silicon film is a film for converting light energy of the diode laser into thermal energy and should be removed in a later step in order to complete a thin film transistor. That is, the method is a method in which an amorphous semiconductor film is heated only by conduction heating to form a microcrystalline semiconductor film.

SUMMARY OF THE INVENTION

There is a problem in that the surface of a crystal grain of a microcrystalline semiconductor film is easily oxidized. Therefore, if a crystal grain of a channel formation region is oxidized, an oxide film is formed on the surface of the crystal grain, so that there is a problem in that electric characteristics of a thin film transistor are decreased. Further, since a microcrystalline semiconductor film has higher mobility than an amorphous silicon film, there is a possibility that off current as well as on current is increased.

In view of the foregoing problems, it is an object of the present invention to improve electric characteristics of a transistor and a display device having the transistor. Alternatively, it is an object of the present invention to improve reliability of a transistor and a display device having the transistor.

A display device in accordance with one aspect of the present invention includes a gate electrode, a gate insulating film provided over the gate electrode, a first semiconductor layer provided over the gate insulating film and having a microcrystalline semiconductor, a second semiconductor layer provided over the first semiconductor layer and having an amorphous semiconductor, and a source region and a drain region provided over the second semiconductor layer. The first semiconductor layer has high crystallinity than the second semiconductor layer. The second semiconductor layer includes an impurity region having a conductivity type different from a conductivity type of the source region and the drain region between the source region and the drain region.

A display device in accordance with one aspect of the present invention can have a structure in which the second semiconductor layer includes a depressed portion between the source region and the drain region in the above-described structure.

A display device in accordance with one aspect of the present invention can have a structure in which the impurity region is also formed below an end portion of the source region and an end portion of the drain region in any of the above-described structures.

A display device in accordance with one aspect of the present invention can have a structure in which the thickness of the first semiconductor layer is smaller than the thickness of the second semiconductor layer in any of the above-described structures.

A display device in accordance with one aspect of the present invention can have a structure in which the amorphous semiconductor has n-type conductivity and the impurity region has p-type conductivity in any of the above-described structures.

A display device in accordance with one aspect of the present invention can have a structure in which the microcrystalline semiconductor is microcrystalline silicon and the amorphous semiconductor is amorphous silicon in any of the above-described structures.

A method for manufacturing a display device, in accordance with one aspect of the present invention, includes the following steps: forming a gate electrode over a substrate; forming a gate insulating film over the gate electrode; stacking a first semiconductor layer having a microcrystalline semiconductor, a second semiconductor layer having an amorphous semiconductor, and a third semiconductor layer to which an impurity which imparts one conductivity type is added sequentially over the gate insulating film; forming a conductive film over the third semiconductor layer; selectively forming a mask over the conductive film ; forming a source electrode and a drain electrode, and a source region and a drain region by etching the conductive film and the third semiconductor layer by using the mask; and forming an impurity region in the second semiconductor layer between the source region and the drain region by introducing an impurity element having a conductivity type different from a conductivity type of the source region and the drain region by using the mask.

A method for manufacturing a display device, in accordance with one aspect of the present invention, includes the following steps: forming a gate electrode over a substrate; forming a gate insulating film over the gate electrode; stacking a first semiconductor layer having a microcrystalline semiconductor, a second semiconductor layer having an amorphous semiconductor, and a third semiconductor layer to which an impurity which imparts one conductivity type is added sequentially over the gate insulating film; forming a conductive film over the third semiconductor layer; selectively forming a mask over the conductive film ; forming a source electrode and a drain electrode, and a source region and a drain region by etching the conductive film and the third semiconductor layer by using the mask; exposing the surface of end portions of the source region and the drain region by selectively etching end portions of the source electrode and the drain electrode ; and forming an impurity region in the second semiconductor layer between the source region and the drain region by introducing an impurity element having a conductivity type different from a conductivity type of the source region and the drain region by using the source electrode and the drain electrode as a mask.

In a method for manufacturing a display device, in accordance with one aspect of the present invention, the first semiconductor layer is formed thinner than the second semiconductor layer in any of the above-described structures.

In a method for manufacturing a display device, in accordance with one aspect of the present invention, the amorphous semiconductor is formed to have n-type conductivity and a p-type impurity element is used as the impurity element in any of the above-described structures.

In addition, a display device refers to a light-emitting device and a liquid crystal display device. A light-emitting device includes a light-emitting element. A liquid crystal display device includes a liquid crystal element. A light-emitting element refers to an element, luminance of which is controlled by current or voltage. Specifically, a light-emitting element refers to an inorganic EL (electroluminescence) element, an organic EL element, and the like.

Further, a display device includes a panel where a display element is sealed and a module where an IC or the like including a controller is mounted on the panel.

According to the present invention, electric characteristics of a transistor and a display device having the transistor can be improved. Further, reliability of a transistor and a display device having the transistor can be improved.

BRIEF DESCRIPTION OF THE DRAWINGS

In the accompanying drawings:

FIGS. 16A to 16C illustrate an example of a method for manufacturing a display device of the present invention;

DETAILED DESCRIPTION OF THE INVENTION

Figure 1A:
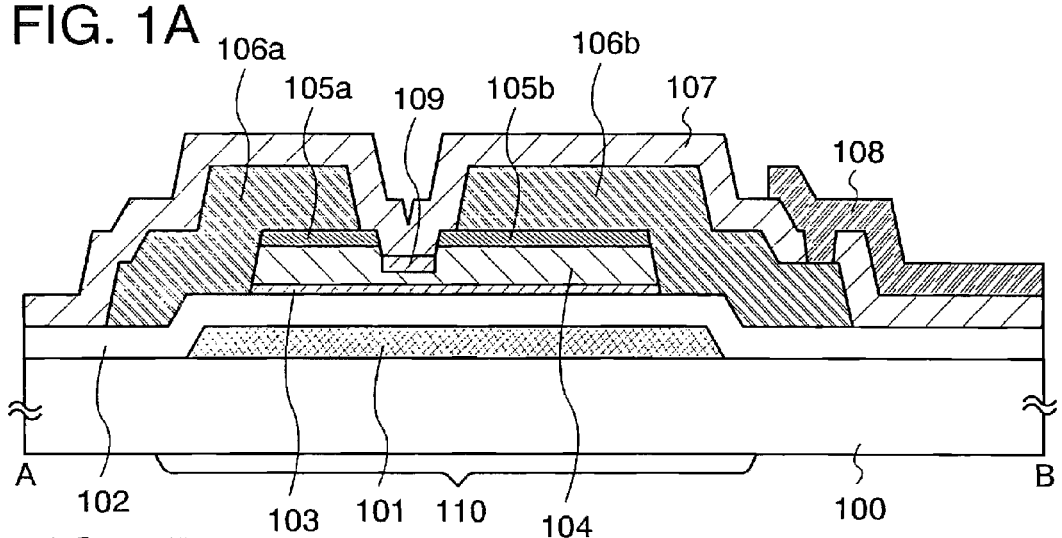
FIGS. 1A and 1B illustrate an example of a display device of the present invention.

Hereinafter, embodiment modes and an example of the present invention will be described with reference to the drawings. Note that the present invention can be implemented in various different ways and it will be readily appreciated by those skilled in the art that various changes and modifications are possible without departing from the spirit and the scope of the present invention. Therefore, the present invention should not be construed as being limited to the following description of the embodiment modes and example. Therefore, the present invention should not be construed as being limited to the following description of the embodiment modes and example. Note that in all the drawings for describing the embodiment modes and example, like portions or portions having similar functions are denoted by the same reference numerals, and description thereof is not repeated.

(Embodiment Mode 1)

Figure 1B:
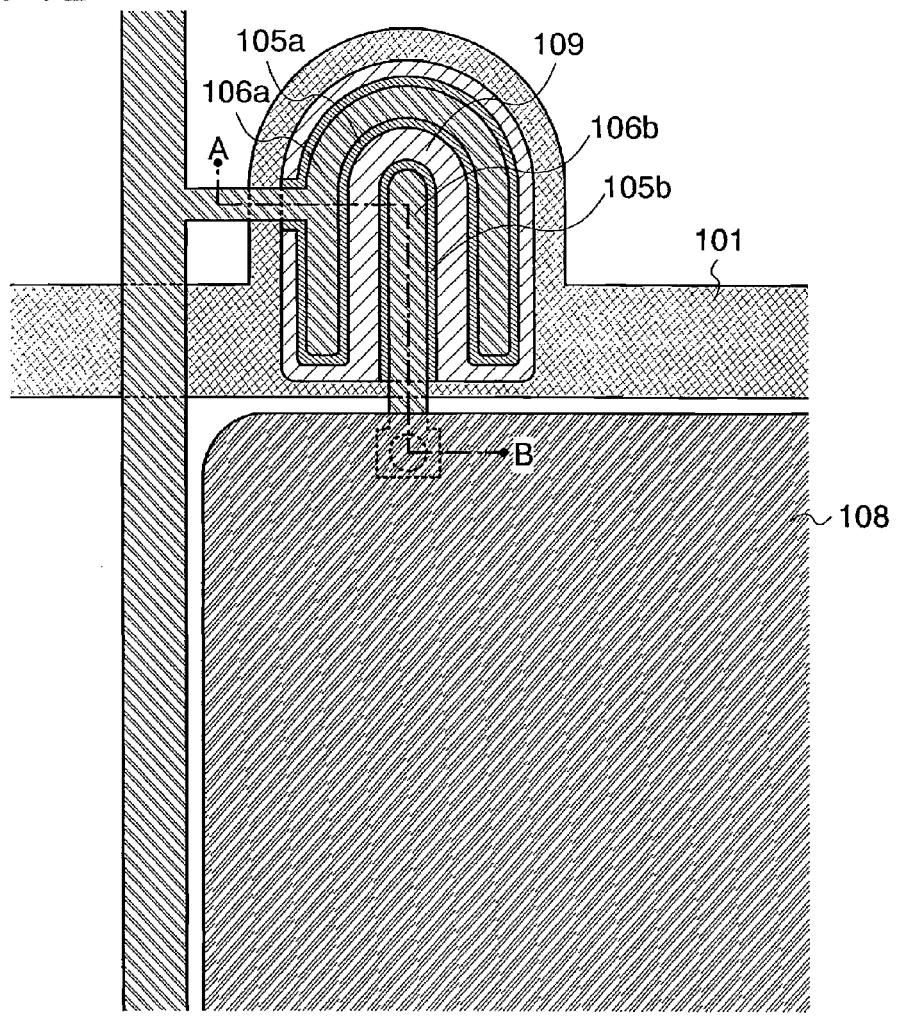

In this embodiment mode, a bottom-gate thin film transistor (TFT) used for a display device is described with reference to drawings. FIGS. 1A and 1B are a cross-sectional view and a top view of a thin film transistor and a pixel electrode electrically connected to the thin film transistor in part of a pixel, respectively. FIG. 1A corresponds to a cross section taken along the line A-B in FIG. 1B.

A thin film transistor 110 included in a display device includes a gate electrode 101 provided over a substrate 100, a first semiconductor layer 103 which is provided over the gate electrode 101 through a gate insulating film 102 and has a microcrystalline semiconductor, a second semiconductor layer 104 which is provided over the first semiconductor layer 103 and has an amorphous semiconductor, an impurity region 109 provided in part of the second semiconductor layer 104, a source region 105a and a drain region 105b which are provided over the second semiconductor layer 104, and a source electrode 106a and a drain electrode 106b (see FIGS. 1A and 1B). The source electrode 106a is in contact with the source region 105a. The drain electrode 106b is in contact with the drain region 105b. In addition, a pixel electrode 108 is electrically connected to the drain electrode 106b through an insulating film 107.

Further, FIGS. 1A and 1B show a channel-etched thin film transistor. In the second semiconductor layer 104, a depressed portion (a hollow) is provided between the source region 105a and the drain region 105b.

In the thin film transistor 110 shown in FIGS. 1A and 1B, the first semiconductor layer 103 has higher crystallinity than the second semiconductor layer 104, the first semiconductor layer 103 functions as a channel formation region of the thin film transistor 110, and the second semiconductor layer 104 functions as a buffer layer. The second semiconductor layer 104 which functions as a buffer layer prevents the first semiconductor layer 103 which functions as a channel formation region from being oxidized. Note that crystallinity indicates the degree of regularity of atomic arrangement in a crystal. In general, when a transistor is formed using a semiconductor layer with favorable crystallinity (also referred to as high crystallinity or improved crystallinity), electric characteristics of the transistor is favorable.

In this embodiment mode, the first semiconductor layer 103 is formed using a microcrystalline semiconductor (e.g., microcrystalline silicon), and the second semiconductor layer 104 is formed using an amorphous semiconductor (e.g., amorphous silicon). Since a microcrystalline semiconductor is formed of microcrystals, the microcrystalline semiconductor has lower resistance than an amorphous semiconductor. Therefore, when the thin film transistor 110 is on, carries mainly transfers from the source region 105a to the drain region 105b through the first semiconductor layer 103.

In addition, when the second semiconductor layer 104 which functions as a buffer layer is provided, oxidation of the first semiconductor layer 103 can be suppressed and decrease in electric characteristics of the thin film transistor 110 can be prevented. Further, withstand voltage of the thin film transistor can be improved and parasitic capacitance can be reduced. The second semiconductor layer 104 which functions as a buffer layer may be provided using an intrinsic semiconductor, or may be provided using an amorphous semiconductor (e.g., amorphous silicon) exhibiting the same conductivity type as the source region 105a and the drain region 105b. In such a case, characteristics of on current of the thin film transistor 110 can be improved. For example, in the case where the thin film transistor 110 is an n-channel thin film transistor, the second semiconductor layer 104 can be provided using an amorphous semiconductor exhibiting weak n-type conductivity.

The impurity region 109 is provided at least in a region positioned between the source region 105a and the drain region 105b in the second semiconductor layer 104. An impurity element having a conductivity type different from the conductivity type of the source region 105a and the drain region 105b is introduced into the impurity region 109. Therefore, in the case where the thin film transistor 110 is an n-channel thin film transistor, an impurity element which imparts p-type conductivity is introduced into the impurity region 109; and in the case where the thin film transistor 110 is a p-channel thin film transistor, an impurity element which imparts n-type conductivity is introduced into the impurity region 109.

When the impurity region 109 is provided, off current (leakage current) with the thin film transistor off can be effectively reduced. The reason for this is as follows.

With the thin film transistor 110 off, when carriers move on a top surface side of the second semiconductor layer 104 due to an electric field which is generated by a potential applied to the gate electrode 101, leakage current is generated between the source region 105a and the drain region 105b. Therefore, when the impurity region 109 having a conductivity type different from the conductivity type of the source region 105a and the drain region 105b is provided at a portion through which current easily flows and the impurity region 109 functions as a region which inhibits carrier transfer, leakage current can be reduced.

Figure 10:
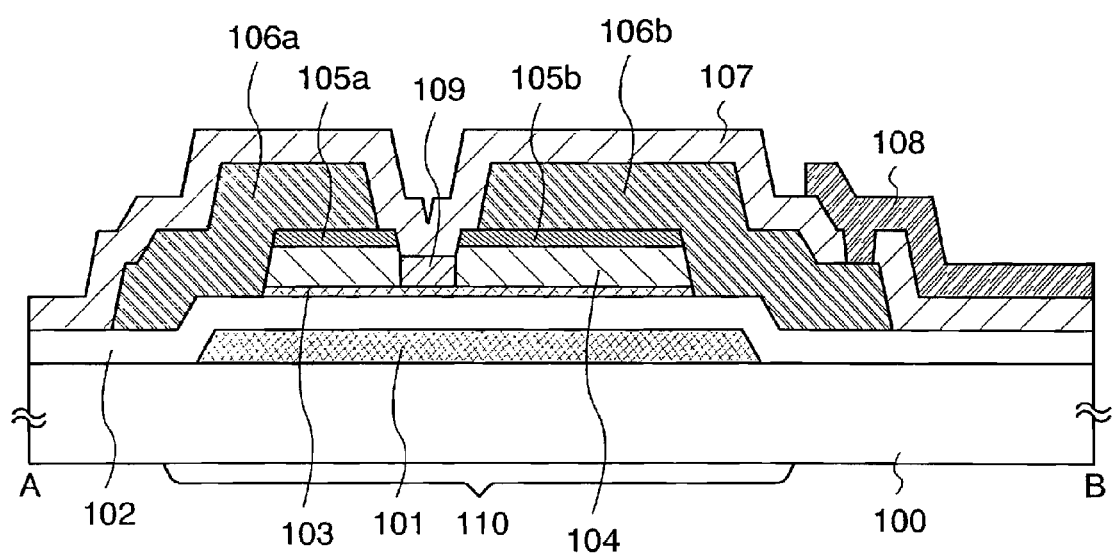
FIG. 10 illustrates an example of a display device of the present invention.

Accordingly, it is preferable that the impurity region 109 be provided at least on a top surface side in a depth direction of the second semiconductor layer 104 positioned between the source region 105a and the drain region 105b (see FIG. 1A). More preferably, the impurity region 109 is provided over the entire region in the depth direction of the second semiconductor layer 104 (see FIG. 10).

Alternatively, an impurity element having a conductivity type different from the conductivity type of the source region 105a and the drain region 105b may be contained in the first semiconductor layer 103. When an impurity element is introduced into the first semiconductor layer 103, the threshold voltage of the thin film transistor 110 can be controlled.

Note that with the thin film transistor 110 on, since carriers transfer from the source region 105a to the drain region 105b through the first semiconductor layer 103 between the source region 105a and the drain region 105b as described above, the impurity region 109 less affects on current of the transistor. When a first semiconductor layer with high crystallinity and a second semiconductor layer with low crystallinity are stacked on a gate electrode side, an impurity region which functions as a region which inhibits carrier transfer is provided in the second semiconductor layer, which can serve as a path of leakage current, and on current flows through the first semiconductor layer in this manner, electric characteristics of the thin film transistor can be improved (leakage current can be reduced without reducing on current).

Further, when the structure of FIGS. 1A and 1B is employed, the first semiconductor layer 103 which serves as a channel formation region can be made thinner while decrease in electric characteristics of a thin film transistor due to oxidation of a semiconductor film, increase in parasitic capacitance of the thin film transistor, and deterioration of the thin film transistor at the time of high voltage application is suppressed.

Usually, in a bottom-gate thin film transistor, in the case where a semiconductor film which serves as a channel formation region is formed thinner, decrease in electric characteristics of the thin film transistor due to oxidation of the semiconductor film, increase in parasitic capacitance (between a gate electrode and a source electrode or a drain electrode) of the thin film transistor, and deterioration (withstand voltage) of the thin film transistor at the time of high voltage application become problematic.

However, when the second semiconductor layer 104 which functions as a buffer layer is formed thicker, problems such as oxidation of a semiconductor film, parasitic capacitance, and withstand voltage can be suppressed. Meanwhile, when the impurity region 109 is provided in the second semiconductor layer 104 positioned between the source region 105a and the drain region 105b, leakage current of the thin film transistor 110 can be reduced.

When the first semiconductor layer 103 which functions as a channel formation region is formed thinner and the thin film transistor 110 is formed as a fully-depleted thin film transistor, high-speed operation and low power consumption can be realized.

When the second semiconductor layer 104 where the impurity region 109 is provided as a buffer layer over the first semiconductor layer 103 which functions as a channel formation region as described above, a display device including a thin film transistor with high electric characteristics and high reliability can be manufactured.

Note that although a region and an electrode which are electrically connected to a source line (a signal line) are described as a source region and a source electrode, and a region and an electrode which are electrically connected to a pixel electrode are described as a drain region and a drain electrode in this embodiment mode, the source region and the drain region are switched with each other and the source electrode and the drain electrode are switched with each other in some cases in accordance with a potential which is applied to the thin film transistor 110.

This embodiment mode can be combined with any of the structures described in other embodiment modes.

(Embodiment Mode 2)

In this embodiment mode, a method for manufacturing the bottom-gate thin film transistor used for a display device, which is described in Embodiment Mode 1, is described with reference to drawings. An n-channel thin film transistor is described below.

Figure 2A:
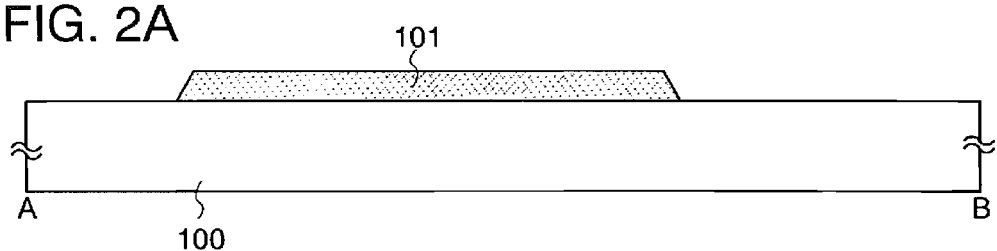
FIGS. 2A to 2D illustrate an example of a method for manufacturing a display device of the present invention.
Figure 5A:
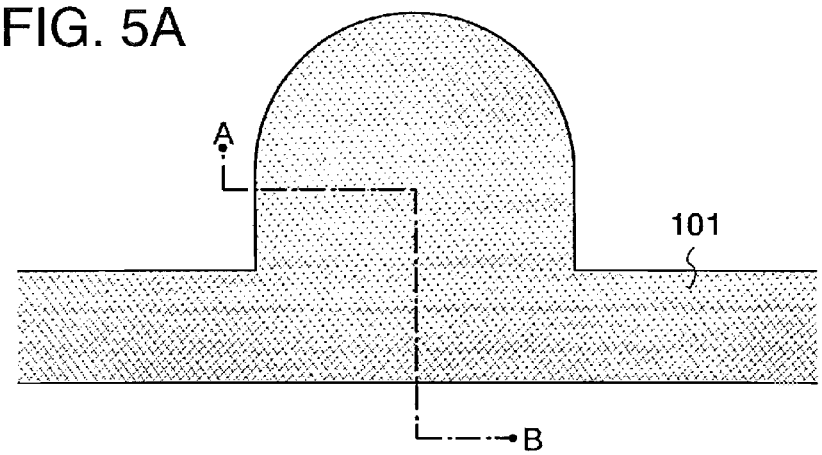
FIGS. 5A to 5C illustrate an example of a method for manufacturing a display device of the present invention.

First, the gate electrode 101 is formed over the substrate 100 (see FIG. 2A and FIG. 5A).

As the substrate 100, any of the following substrates can be used: an alkali-free glass substrate formed of barium borosilicate glass, aluminoborosilicate glass, aluminosilicate glass, or the like by a fusion method or a float method; a ceramic substrate; a plastic substrate having heat resistance enough to withstand a process temperature of this manufacturing process; and the like. Alternatively, a metal substrate of a stainless alloy or the like with the surface provided with an insulating layer may be used. When the substrate 100 is a mother glass, the substrate may have any of the following sizes: the first generation (e.g., 320 mm×400 mm), the second generation (e.g., 400 mm×500 mm), the third generation (e.g., 550 mm×650 mm), the fourth generation (e.g., 680 mm×880 mm or 730 mm×920 mm), the fifth generation (e.g., 1000 mm×1200 mm or 1100 mm×1300 mm), the sixth generation (e.g., 1500 mm×1800 mm), the seventh generation (e.g., 1900 mm×2200 mm), the eighth generation (e.g., 2160 mm×2460 mm), the ninth generation (e.g., 2400 mm×2800 mm), the tenth generation (e.g., 2850 mm×3050 mm), and the like.

The gate electrode 101 is formed using a metal such as titanium, molybdenum, chromium, tantalum, tungsten, or aluminum, or an alloy material thereof. The gate electrode 101 can be formed in such a manner that a conductive film is formed over the substrate 100 by a sputtering method or a vacuum evaporation method; a mask is formed over the conductive film by a photolithography technique or an inkjet method; and the conductive film is etched using the mask. Alternatively, the gate electrode 101 can be formed by discharging a conductive nanopaste of silver, gold, copper, or the like by an inkjet method and baking the conductive nanopaste. Note that as barrier metal which increases adhesion between the gate electrode 101 and the substrate 100, a nitride film of any of the above-described metals may be provided between the substrate 100 and the gate electrode 101. Here, the gate electrode 101 is formed by etching the conductive film formed over the substrate 100 by using a resist mask formed using a photomask.

Note that since semiconductor films and wirings are formed over the gate electrode 101, it is preferable that the gate electrode 101 be processed so that end portions thereof are tapered in order to prevent disconnection. In addition, a wiring which is connected to the gate electrode can be formed at the same time as forming the gate electrode 101.

Figure 2B:
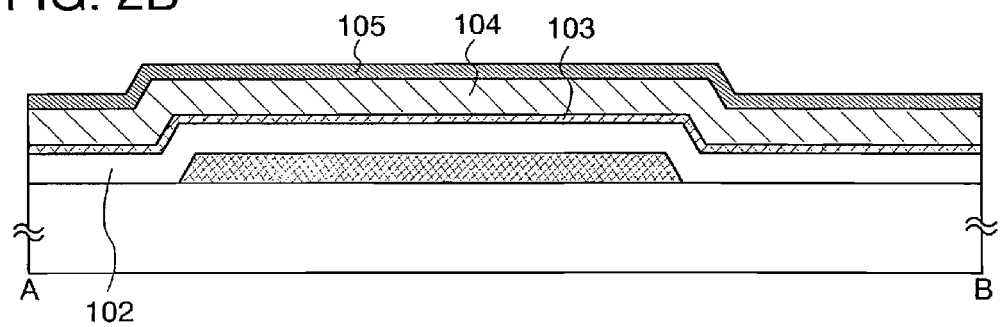

Next, the gate insulating film 102, the first semiconductor layer 103 having a microcrystalline semiconductor, the second semiconductor layer 104 which functions as a buffer layer, and the third semiconductor layer 105 to which an impurity which imparts one conductivity type is added are formed in that order over the gate electrode 101 (see FIG. 2B).

It is preferable that the gate insulating film 102, the first semiconductor layer 103, and the second semiconductor layer 104 be formed successively. It is more preferable that the gate insulating film 102, the first semiconductor layer 103, the second semiconductor layer 104, and the third semiconductor layer 105 to which an impurity which imparts one conductivity type is added be formed successively. When the gate insulating film 102, the first semiconductor layer 103, and the second semiconductor layer 104 are formed successively without being exposed to the atmosphere, each interface between stacked layers can be formed without being contaminated by an atmospheric constituent or a contaminant impurity element floating in the atmosphere. Thus, variations in electric characteristics of thin film transistors can be reduced.

The gate insulating film 102 can be formed of a silicon oxide film, a silicon nitride film, a silicon oxynitride film, or a silicon nitride oxide film by a CVD method, a sputtering method, or the like. Here, the case is described in which a silicon oxide film or a silicon oxynitride film, and a silicon nitride film or a silicon nitride oxide film are formed in that order as the gate insulating film 102. Note that the gate insulating film can be formed with a three-layer structure in which a silicon nitride film or a silicon nitride oxide film, a silicon oxide film or a silicon oxynitride film, and a silicon nitride film or a silicon nitride oxide film are stacked from the substrate side in that order, instead of forming the gate insulating film with a two-layer structure. Alternatively, the gate insulating film may be formed of a single layer of a silicon oxide film, a silicon nitride film, a silicon oxynitride film, or a silicon nitride oxide film. Further, it is preferable that the gate insulating film be formed by using a microwave plasma CVD apparatus with a frequency of higher than or equal to 1 GHz. A silicon oxynitride film or a silicon nitride oxide film formed by a microwave plasma CVD apparatus has high withstand voltage, and reliability of a thin film transistor which is formed later can be improved.

Here, a silicon oxynitride film refers to a film which contains more oxygen than nitrogen and contains oxygen, nitrogen, silicon, and hydrogen at concentrations ranging from 55 to 65 at. %, 1 to 20 at. %, 25 to 35 at. %, and 0.1 to 10 at. %, respectively. Further, a silicon nitride oxide film refers to a film which contains more nitrogen than oxygen and contains oxygen, nitrogen, silicon, and hydrogen at concentrations ranging from 15 to 30 at. %, 20 to 35 at. %, 25 to 35 at. %, and 15 to 25 at. %, respectively.

The microcrystalline semiconductor forming the first semiconductor layer 103 is a film having an intermediate structure between amorphous and crystalline structures (including a single crystal and a polycrystal). A microcrystalline semiconductor is a semiconductor which has a third state which is stable in free energy, is a crystalline semiconductor which has a short-range order and lattice distortion, and can be dispersed in a non-single-crystal semiconductor, with a grain size of 0.5 to 20 nm. Microcrystalline silicon, which is a typical example of a microcrystalline semiconductor, has a Raman spectrum which is shifted to a wave number side lower than 520.6 cm$^{-1}$ that represents single-crystal silicon. That is, the peak of a Raman spectrum of microcrystalline silicon is in the range of 481 cm$^{-1}$ to 520.6 cm$^{-1}$. In addition, microcrystalline silicon contains hydrogen or halogen of at least 1 at. % or more in order to terminate a dangling bond. Moreover, microcrystalline silicon contains a rare gas element such as helium, argon, krypton, or neon to further promote lattice distortion, so that stability is increased and a favorable microcrystalline semiconductor can be obtained.

The microcrystalline semiconductor can be formed by a high-frequency plasma CVD method with a frequency of several tens to several hundreds of megahertz (preferably 27 to 100 MHz (typically 60 MHz)) or a microwave plasma CVD method with a frequency of higher than or equal to 1 GHz. Typically, the microcrystalline semiconductor can be formed using a dilution of silicon hydride such as $SiH_4$ or $Si_2H_6$ with hydrogen. With a dilution with one or a plural kinds of rare gas elements selected from helium, argon, krypton, or neon in addition to silicon hydride and hydrogen, the microcrystalline semiconductor can be formed. In that case, the flow ratio of hydrogen to silicon hydride is 5:1 to 200:1, preferably 50:1 to 150:1, more preferably 100:1. Note that instead of silicon hydride, $SiH_2Cl_2$, $SiHCl_3$, $SiCl_4$, $SiF_4$, or the like can be used.

A microcrystalline semiconductor exhibits weak n-type conductivity when an impurity element for valence control is not intentionally added. Thus, the threshold voltage can be controlled by adding an impurity element which imparts p-type conductivity to a microcrystalline semiconductor which functions as a channel formation region of a thin film transistor at the same time as or after film formation. A typical example of an impurity element which imparts p-type conductivity is boron, and an impurity gas such as $B_2H_6$ or $BF_3$ may be mixed into silicon hydride at a proportion of 1 to 1000 ppm, preferably 1 to 100 ppm. The concentration of boron may be, for example, $1\times10^{14}$ to $6\times10^{16}/cm^3$.

In addition, the oxygen concentration of the microcrystalline semiconductor is preferably $1\times10^{19}/cm^3$ or less, more preferably $5\times10^{18}/cm^3$ or less and each of the nitrogen concentration and the carbon concentration is preferably $5\times10^{18}/cm^3$ or less, more preferably $1\times10^{18}/cm^3$ or less. When concentrations of oxygen, nitrogen, and carbon to be mixed into the microcrystalline semiconductor are decreased, the microcrystalline semiconductor can be prevented from being an n-type semiconductor.

The first semiconductor layer 103 is formed to a thickness of larger than 0 nm and equal to or smaller than 50 nm, preferably larger than 0 nm and equal to or smaller than 20 nm. The first semiconductor layer 103 functions as a channel formation region of a thin film transistor which is formed later. When the thickness of the first semiconductor layer 103 is within the above-described range, a thin film transistor can be made a fully-depleted type.

In addition, since the formation rate of the microcrystalline semiconductor included in the first semiconductor layer 103 is low, i.e., a tenth to a hundredth of the formation rate of an amorphous semiconductor, throughput can be improved when the microcrystalline semiconductor is formed thin.

Furthermore, since a microcrystalline semiconductor contains microcrystals, it has lower resistance than an amorphous semiconductor. Therefore, by using a thin film transistor using a microcrystalline semiconductor, a rising portion of a curve of current-voltage characteristics has a steep slope. Thus, a thin film transistor using a microcrystalline semiconductor has an excellent response as a switching element and can operate at high speed. When microcrystalline semiconductors are used for channel formation regions of thin film transistors, fluctuation in the threshold voltage of the thin film transistors can be suppressed. When the fluctuation in the threshold voltage is suppressed, a liquid crystal display device with little variation in electric characteristics can be manufactured.

A microcrystalline semiconductor has higher mobility than an amorphous semiconductor. Thus, when a thin film transistor, a channel formation region of which is formed using a microcrystalline semiconductor, is used for switching a display element, the area of the channel formation region, i.e., the area of the thin film transistor can be decreased. Therefore, the area of the thin film transistor in each pixel is decreased and the aperture ration of pixels can be increased. Accordingly, a device with high resolution can be manufactured.

The second semiconductor layer 104 which functions as a buffer layer can be formed using silicon hydride such as $SiH_4$ or $Si_2H_6$ by a plasma CVD method. Alternatively, with a dilution of silicon hydride described above with one or plural kinds of rare gas elements selected from helium, argon, krypton, or neon, the amorphous semiconductor can be formed. When hydrogen at a flow rate which is 1 to 20 times, preferably 1 to 10 times, more preferably 1 to 5 times higher than that of silicon hydride is used, a hydrogen-containing amorphous semiconductor can be formed. When silicon hydride described above and nitrogen or ammonia are used, a nitrogen-containing amorphous semiconductor can be formed. When silicon hydride described above and a gas containing fluorine, chlorine, bromine, or iodine ($F_2$, $Cl_2$, $Br_2$, $I_2$, HF, HCl, HBr, HI, or the like) are used, an amorphous semiconductor containing fluorine, chlorine, bromine, or iodine can be formed. Note that instead of silicon hydride, $SiH_2Cl_2$, $SiHCl_3$, $SiCl_4$, $SiF_4$, or the like can be used.

Alternatively, the second semiconductor layer 104 can be formed using an amorphous semiconductor formed by sputtering using an amorphous semiconductor as a target with hydrogen or a rare gas. In this case, when ammonia, nitrogen, or $N_2O$ is contained in an atmosphere, a nitrogen-containing amorphous semiconductor can be formed. Alternatively, when a gas including fluorine, chlorine, bromine, or iodine ($F_2$, $Cl_2$, $Br_2$, $I_2$, HF, HCl, HBr, HI, or the like) is contained in an atmosphere, an amorphous semiconductor containing fluorine, chlorine, bromine, or iodine can be formed.

Alternatively, the second semiconductor layer 104 may be formed by forming an amorphous semiconductor on the surface of the first semiconductor layer 103 by a plasma CVD method or a sputtering method and then by performing hydrogenation, nitridation, or halogenation of the surface of the amorphous semiconductor through processing of the surface of the amorphous semiconductor with hydrogen plasma, nitrogen plasma, or halogen plasma. Alternatively, the surface of the amorphous semiconductor may be processed with helium plasma, neon plasma, argon plasma, krypton plasma, or the like.

The second semiconductor layer 104 is preferably formed using an amorphous semiconductor which does not contain crystal grains. Therefore, when the second semiconductor layer 104 is formed by a high-frequency plasma CVD method with a frequency of several tens to several hundreds of megahertz or a microwave plasma CVD method, formation conditions are preferably controlled so that the amorphous semiconductor does not contain crystal grains. Further, the second semiconductor layer 104 may be formed using an amorphous semiconductor (e.g., an amorphous silicon film) exhibiting n-type conductivity.

Part of the second semiconductor layer 104 is etched in a later step of forming a source region and a drain region in some cases, and the second semiconductor layer 104 is preferably formed to a thickness such that part of the second semiconductor layer 104 remains in that case. Typically, the second semiconductor layer 104 is preferably formed to a thickness of 100 to 500 nm, more preferably 200 to 300 nm.

In a display device in which high voltage (e.g., about 15 V) is applied to a thin film transistor, typically a liquid crystal display device, when the second semiconductor layer 104 which functions as a buffer layer is formed thickly in the above-described range, withstand voltage is increased, so that the thin film transistor can be prevented from deterioration even when high voltage is applied to the thin film transistor. Further, when the second semiconductor layer 104 is formed thickly, a distance between the source region and the drain region, and the first semiconductor layer 103 is increased, so that off current can be reduced. When the second semiconductor layer 104 is formed thick in the above-described range, the second semiconductor layer 104 is thicker than the first semiconductor layer 103.

When an amorphous semiconductor or an amorphous semiconductor containing hydrogen, nitrogen, or halogen is formed on the surface of the first semiconductor layer 103, surfaces of crystal grains contained in the second semiconductor layer 104 can be prevented from being oxidized naturally. In particular, in a region where an amorphous semiconductor is in contact with microcrystal grains, a crack is easily generated due to distortion of a crystal lattice. When this crack is exposed to oxygen, the microcrystal grains are oxidized, so that silicon oxide is formed. However, when the second semiconductor layer 104 which functions as a buffer layer is formed on the surface of the first semiconductor layer 103, microcrystal grains contained in the first semiconductor layer 103 can be prevented from being oxidized. Further, when the buffer layer is formed, a microcrystalline semiconductor can be prevented from being mixed with an etching residue which is generated in forming a source region and a drain region later.

The second semiconductor layer 104 is formed using an amorphous semiconductor or an amorphous semiconductor containing hydrogen, nitrogen, or halogen. An amorphous semiconductor has a larger energy gap than a microcrystalline semiconductor (the energy gap of an amorphous semiconductor is 1.6 to 1.8 eV and the energy gap of a microcrystalline semiconductor is 1.1 to 1.5 eV), has higher resistance, and has lower mobility. Therefore, in a thin film transistor which is formed later, the second semiconductor layer 104 formed between the source region and the drain region and the first semiconductor layer 103 functions as a high-resistance region, and the microcrystalline semiconductor forming the first semiconductor layer 103 functions as a channel formation region.

In the case of forming an n-channel thin film transistor, phosphorus may be added as a typical impurity element to the third semiconductor layer 105 to which an impurity which imparts one conductivity type is added, and an impurity gas such as $PH_3$ may be added to silicon hydride. Alternatively, in the case of forming a p-channel thin film transistor, boron may be added as a typical impurity element to the third semiconductor layer 105 to which an impurity which imparts one conductivity type is added, and an impurity gas such as $B_2H_6$ may be added to silicon hydride. The third semiconductor layer 105 to which an impurity which imparts one conductivity type is added can be formed using a microcrystalline semiconductor or an amorphous semiconductor. The third semiconductor layer 105 to which an impurity which imparts one conductivity type is added is formed to a thickness of 2 to 5 nm. When the third semiconductor layer 105 to which an impurity which imparts one conductivity type is added is formed thin, throughput can be improved.

Figure 9:
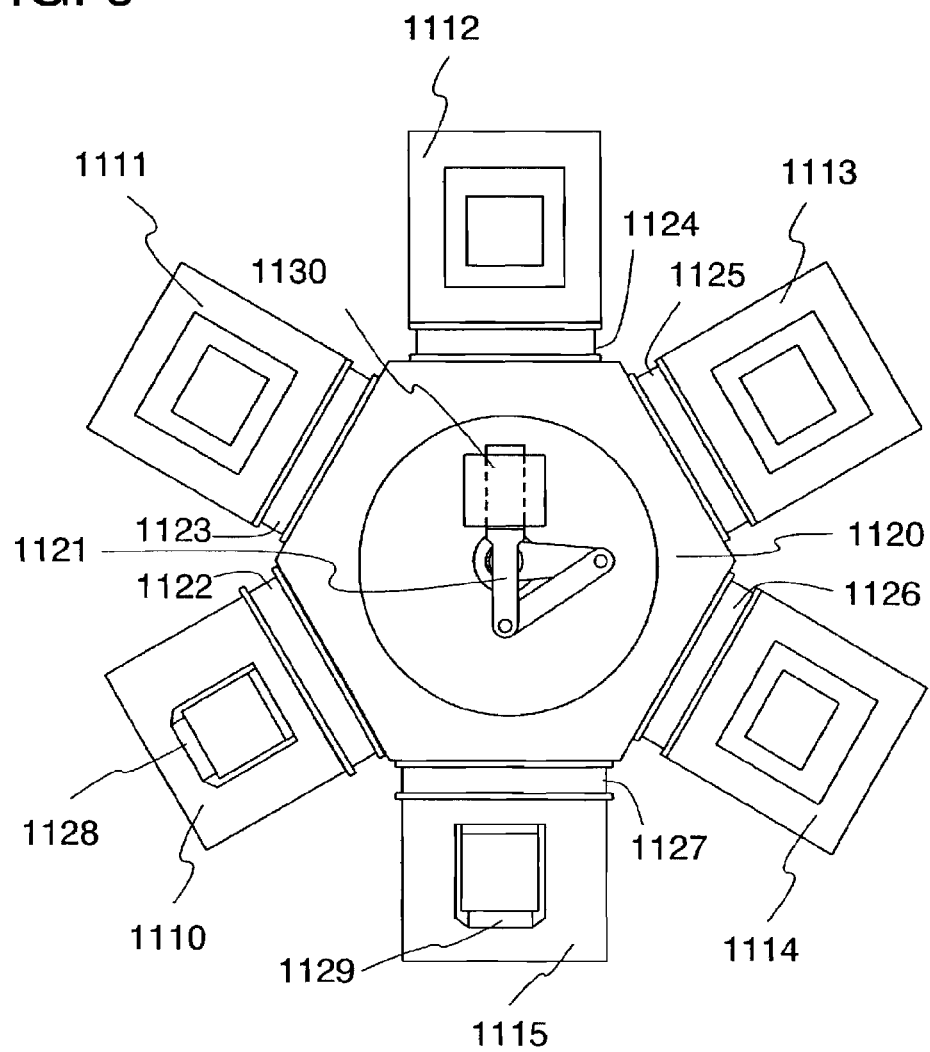
FIG. 9 illustrates an example of a method for manufacturing a display device of the present invention.

Here, a microwave plasma CVD apparatus, with which the gate insulating film 102 to the third semiconductor layer 105 to which an impurity which imparts one conductivity type is added can be formed successively, is described with reference to FIG. 9. FIG. 9 is a schematic diagram showing a top cross section of a microwave plasma CVD apparatus, which includes a loading chamber 1110, an unloading chamber 1115, and first to fourth reaction chambers 1111 to 1114 around a common chamber 1120. Between the common chamber 1120 and the other chambers, gate valves 1122 to 1127 are provided so that processes performed in the chambers do not interfere with each other. Substrates 1130 are loaded into a cassette 1128 in the loading chamber 1110 and a cassette 1129 in the unloading chamber 1115 and carried to the first to fourth reaction chambers 1111 to 1114 with a transport means 1121 of the common chamber 1120. In this apparatus, a reaction chamber can be allocated for each different kinds of deposition films, and a plurality of different films can be formed successively without being exposed to the atmosphere.

In each of the first to fourth reaction chambers, the gate insulating film 102, the first semiconductor layer 103, the second semiconductor layer 104, and the third semiconductor layer 105 to which an impurity which imparts one conductivity type is added are stacked. In this case, a plurality of layers of different kinds can be stacked successively by changing of source gases. In this case, after the gate insulating film is formed, silicon hydride such as silane is introduced into the reaction chamber, residual oxygen and silicon hydride are reacted with each other, and the reactant is exhausted from the reaction chamber, so that the concentration of residual oxygen in the reaction chamber can be decreased. Accordingly, the concentration of oxygen contained in the microcrystalline semiconductor can be decreased. In addition, crystal grains contained in the microcrystalline semiconductor can be prevented from being oxidized.

Alternatively, the gate insulating film 102, the first semiconductor layer 103, and the second semiconductor layer 104 are formed in each of the first reaction chamber and the third reaction chamber, and the third semiconductor layer 105 to which an impurity which imparts one conductivity type is added is formed in each of the second reaction chamber and the fourth reaction chamber. When the third semiconductor layer 105 to which an impurity which imparts one conductivity type is added is formed separately, an impurity which imparts one conductivity type which remains in the chamber can be prevented from being mixed into another layer.

The gate insulating film 102, the first semiconductor layer 103, the second semiconductor layer 104, and the third semiconductor layer 105 to which an impurity which imparts one conductivity type is added can be formed at the same time by using a microwave plasma CVD apparatus to which a plurality of chambers are connected, as described above. Thus, mass productivity can be improved. In addition, even when maintenance or cleaning is performed on one of reaction chambers, a film formation process can be performed in other reaction chambers, so that take time for film formation can be improved. Further, each interface between stacked layers can be formed without being contaminated by an atmospheric constituent or a contaminant impurity element floating in the atmosphere. Thus, variations in characteristics of thin film transistors can be reduced.

Alternatively, the gate insulating film 102 can be formed in the first reaction chamber, the microcrystalline semiconductor forming the first semiconductor layer 103 and the second semiconductor layer 104 can be formed in the second reaction chamber, and the third semiconductor layer 105 to which an impurity which imparts one conductivity type is added can be formed in the third reaction chamber. Alternatively, when the gate insulating film 102 is formed with a stacked-layer structure of a silicon oxide film or a silicon oxynitride film, and a silicon nitride film or a silicon nitride oxide film, five reaction chambers may be provided. The silicon oxide film or the silicon oxynitride film may be formed in the first reaction chamber; the silicon nitride film or the silicon nitride oxide film may be formed in the second reaction chamber; the microcrystalline semiconductor forming the first semiconductor layer 103 may be formed in the third reaction chamber; the second semiconductor layer 104 may be formed in the fourth reaction chamber; and the third semiconductor layer 105 to which an impurity which imparts one conductivity type is added may be formed in the fifth reaction chamber. Alternatively, since the formation rate of microcrystalline semiconductors is low, the microcrystalline semiconductors may be formed by using a plurality of reaction chambers. For example, the gate insulating film 102 may be formed in the first reaction chamber, the microcrystalline semiconductors forming the first semiconductor layer 103 may be formed in the second reaction chamber and the third reaction chamber, the second semiconductor layer 104 may be formed in the fourth reaction chamber, and the third semiconductor layer 105 to which an impurity which imparts one conductivity type is added may be formed in the fifth reaction chamber. In this manner, when the microcrystalline semiconductors forming the first semiconductor layer 103 are formed at the same time by using a plurality of reaction chambers, throughput can be improved. In this case, it is preferable that the inner wall of each reaction chamber be coated with a film of the same kind as a film to be formed therein.

When a microwave plasma CVD apparatus having such a structure is used, films of similar kinds or a film of one kind can be formed in each reaction chamber and can be formed successively without being exposed to the atmosphere. Therefore, each interface between stacked layers can be formed without being contaminated by a residue of the formed film or an impurity element floating in the atmosphere.

Note that although the microwave plasma CVD apparatus shown in FIG. 9 is provided with the loading chamber and the unloading chamber separately, the loading chamber and the unloading chamber may be combined. In addition, the microwave plasma CVD apparatus may be provided with a spare chamber. When a substrate is preheated in the spare chamber, heating time needed before film formation in each reaction chamber can be shortened. Thus, throughput can be improved.

Next, a film formation process is described. In the film formation process, a gas to be supplied from a gas supply portion may be selected depending on the purpose.

Here, a method in which a silicon oxynitride film and a silicon nitride oxide film are stacked as the gate insulating film 102 is described as an example.

First, the inside of a processing container in a reaction chamber of the microwave plasma CVD apparatus is cleaned with fluorine radicals. Note that the inside of the reaction chamber can be cleaned by introducing fluorine radicals into the reaction chamber, which are generated by introducing carbon fluoride, nitrogen fluoride, or fluorine into a plasma generator provided outside the reaction chamber and dissociating the gas.

When a large amount of hydrogen is introduced into the reaction chamber after the inside of the reaction chamber is cleaned with fluorine radicals, residual fluorine inside the reaction chamber can be reacted with hydrogen, so that the concentration of residual fluorine can be decreased. Thus, the amount of fluorine to be mixed into a protective film which is to be formed later on the inner wall of the reaction chamber can be decreased, and the thickness of the protective film can be decreased.

Next, on the surface of the inner wall of the processing container in the reaction chamber, or the like, a silicon oxynitride film is deposited as the protective film. Here, the pressure in the processing container is 1 to 200 Pa, preferably 1 to 100 Pa, and one or more kinds of rare gases such as helium, argon, xenon, or krypton are introduced as a plasma ignition gas. Further, hydrogen is introduced in addition to any one kind of rare gases. In particular, it is preferable that helium, moreover, a mixed gas of helium and hydrogen be used as a plasma ignition gas.

Although helium has a high ionization energy of 24.5 eV, it has a metastable state at about 20 eV. Thus, helium can be ionized at about 4 eV during discharge. Therefore, discharge starting voltage is low and discharge can be maintained easily. Accordingly, plasma can be maintained uniformly, and power can be saved.

Alternatively, as the plasma ignition gas, an oxygen gas and one or more kinds of rare gases such as helium, argon, xenon, or krypton may be introduced. When an oxygen gas as well as a rare gas is introduced into the processing container, plasma ignition can be facilitated.

Next, a microwave generating apparatus is turned on and the output of the microwave generating apparatus is 500 to 6000 W, preferably 4000 to 6000 W to generate plasma. Then, a source gas is introduced into the processing container through a gas pipe. Specifically, when dinitrogen monoxide, a rare gas, and silane are introduced as a source gas, a silicon nitride oxide film is formed as the protective film on the inner wall of the processing container and on the surfaces of the gas pipe, a dielectric plate, and a support base. At this time, the flow rate of silicon hydride is 50 to 300 sccm, the flow rate of dinitrogen monoxide is 500 to 6000 sccm, and the thickness of the protective film is 500 to 2000 nm.

Next, supply of the source gas is stopped, the pressure in the processing container is decreased, and the microwave generating apparatus is turned off. After that, a substrate is introduced onto the support base in the processing container.

Next, through a process which is similar to that of the protective film, a silicon oxynitride film is deposited over the substrate as part of the gate insulating film 102.

After the silicon oxynitride film is deposited to a predetermined thickness, supply of the source gas is stopped, the pressure in the processing container is decreased, and the microwave generating apparatus is turned off.

Next, the pressure in the processing container is 1 to 200 Pa, preferably 1 to 100 Pa, and one or more kinds of rare gases such as helium, argon, xenon, or krypton which are a plasma ignition gas, and silane, dinitrogen monoxide, and ammonia which are a source gas are introduced. Note that instead of ammonia, nitrogen may be introduced as the source gas. Then, the microwave generating apparatus is turned on, and the output of the microwave generating apparatus is 500 to 6000 W, preferably 4000 to 6000 W to generate plasma. Next, the source gas is introduced into the processing container through the gas pipe, and a silicon nitride oxide film is formed as part of the gate insulating film 102 on the silicon oxynitride film over the substrate. Then, supply of the source gas is stopped, the pressure in the processing container is decreased, the microwave generating apparatus is turned off, and the film formation process is completed.

Through the above-described process, the silicon oxynitride film is formed as the protective film on the inner wall of the reaction chamber, and the silicon oxynitride film and the silicon nitride oxide film are successively formed over the substrate, so that mixture of an impurity such as silicon oxide into the silicon nitride oxide film on the upper layer side can be suppressed. When the above-described films are formed by a microwave plasma CVD method using a power supply apparatus capable of generating a microwave, plasma density is made higher and films having high withstand voltage can be formed. When the films are used as gate insulating films, variations in the threshold voltage of transistors can be suppressed. In addition, BT characteristics can be improved. Further, resistance to static electricity is increased, and a transistor which is not easily damaged even when high voltage is applied thereto can be manufactured. Furthermore, a transistor which is not easily damaged over time can be manufactured. Moreover, a transistor with less hot carrier damage can be manufactured.

In the case where the silicon oxynitride film which is formed as the gate insulating film by using the microwave plasma CVD apparatus is a single layer, the formation method of the protective film and the formation method of the silicon oxynitride film are used. In particular, when the flow ratio of dinitrogen monoxide to silane is 100:1 to 300:1, preferably 150:1 to 250:1, a silicon oxynitride film having high withstand voltage can be formed.

Next, a film formation process is described in which a microcrystalline semiconductor and an amorphous semiconductor which functions as a buffer layer are successively formed by a microwave plasma CVD method. First, in a manner similar to that of the gate insulating film, the inside of the reaction chamber is cleaned. Next, a silicon film is deposited as a protective film inside the processing container. Here, the pressure in the processing container is 1 to 200 Pa, preferably 1 to 100 Pa, and one or more kinds of rare gases such as helium, argon, xenon, or krypton are introduced as a plasma ignition gas. Note that hydrogen may be introduced together with the rare gas.

Then, the microwave generating apparatus is turned on, and the output of the microwave generating apparatus is 500 to 6000 W, preferably 4000 to 6000 W to generate plasma. Next, a source gas is introduced into the processing container through the gas pipe. Specifically, when a silicon hydride gas and a hydrogen gas are introduced as a source gas, a microcrystalline silicon film is formed as a protective film on the inner wall of the processing container and on the surfaces of the gas pipe, the dielectric plate, and the support base. Alternatively, a microcrystalline semiconductor can be formed from a dilution of a silicon hydride gas and a hydrogen gas with one or more kinds of rare gas elements selected from helium, argon, krypton, or neon. At this time, the flow ratio of hydrogen to silicon hydride is 5:1 to 200:1, preferably 50:1 to 150:1, more preferably 100:1. In addition, the thickness of the protective film at this time is 500 to 2000 nm. Note that before the microwave generating apparatus is turned on, a silicon hydride gas and a hydrogen gas may be introduced into the processing container in addition to the above-mentioned rare gas. Further, the microcrystalline semiconductor is preferably formed at 100 to 200° C. (typically 150° C.).

Alternatively, an amorphous semiconductor can be formed as the protective film using a dilution of a silicon hydride gas and a hydrogen gas with one or more kinds of rare gas elements selected from helium, argon, krypton, or neon.

Then, supply of the source gas is stopped, the pressure in the processing container is decreased, and the microwave generating apparatus is turned off. After that, the substrate is introduced onto the support base in the processing container.

Next, hydrogen plasma treatment is performed on the surface of the gate insulating film 102 which is formed over the substrate. When hydrogen plasma treatment is performed on the surface of the gate insulating film 102 before the microcrystalline semiconductor forming the first semiconductor layer 103 is formed, lattice distortion at the interface between the gate insulating film 102 and the microcrystalline semiconductor can be decreased, and interface characteristics between the gate insulating film 102 and the microcrystalline semiconductor can be improved. Thus, electric characteristics of a thin film transistor which is to be formed later can be improved.

In the hydrogen plasma treatment, hydrogen plasma treatment is also performed on the amorphous semiconductor or the microcrystalline semiconductor which is formed as the protective film inside the processing container, so that the protective film is etched and a slight amount of semiconductor is deposited on the surface of the gate insulating film 102. The slight amount of semiconductor serves as a nucleus of crystal growth, and with the nucleus, the microcrystalline semiconductor is deposited. Accordingly, lattice distortion at the interface between the gate insulating film 102 and the microcrystalline semiconductor can be decreased, and interface characteristics between the gate insulating film 102 and the microcrystalline semiconductor can be improved. Therefore, electric characteristics of a thin film transistor which is to be formed later can be improved.

Next, in a manner similar to that of the protective film, a microcrystalline silicon film is deposited as the first semiconductor layer 103. The thickness of a microcrystalline semiconductor is larger than 0 nm and equal to or smaller than 50 nm, preferably larger than 0 nm and equal to or smaller than 20 nm.

After the microcrystalline silicon film is deposited to a predetermined thickness, supply of the source gas is stopped, the pressure in the processing container is decreased, the microwave generating apparatus is turned off, and the film formation process for the microcrystalline semiconductor is completed.

Next, the pressure in the processing container is reduced so as to adjust the flow rate of a source gas. Specifically, the flow rate of a hydrogen gas is considerably decreased compared to film formation conditions of the microcrystalline semiconductor. Typically, a hydrogen gas at a flow rate which is 1 to 20 times, preferably 1 to 10 times, more preferably 1 to 5 times higher than that of silicon hydride is introduced. Alternatively, not a hydrogen gas but a silicon hydride gas is introduced into the processing container. When the flow rate of hydrogen to silicon hydride is decreased in this manner, the formation rate of the amorphous semiconductor which is formed as the second semiconductor layer 104 can be increased. Alternatively, a silicon hydride gas is diluted with one or more kinds of rare gas elements selected from helium, argon, krypton, or neon. Then, the microwave generating apparatus is turned on, and the output of the microwave generating apparatus is 500 to 6000 W, preferably 4000 to 6000 W to generate plasma. Thus, an amorphous semiconductor can be formed. Since the formation rate of an amorphous semiconductor is higher than that of a microcrystalline semiconductor, the pressure in the processing container can be set low. The thickness of the amorphous semiconductor layer at this time is 100 to 400 nm.

After the amorphous semiconductor is deposited to a predetermined thickness, supply of the source gas is stopped, the pressure in the processing container is decreased, the microwave generating apparatus is turned off, and the film formation process for the amorphous semiconductor is completed.

Note that the microcrystalline semiconductor forming the first semiconductor layer 103 and an amorphous semiconductor forming the second semiconductor layer 104 may be formed while plasma is ignited. Specifically, the microcrystalline semiconductor and the amorphous semiconductor may be stacked while the flow rate of hydrogen to silicon hydride, which is a source gas to form the microcrystalline semiconductor, is gradually decreased. With such a method, an impurity is not deposited at an interface between the microcrystalline semiconductor and the amorphous semiconductor and an interface with little distortion can be formed. Thus, electric characteristics of a thin film transistor which is to be formed later can be improved.

Plasma which is generated by a microwave plasma CVD apparatus with a frequency of higher than or equal to 1 GHz has high electron density and many radicals are generated from a source gas and are supplied to a substrate 1130. Thus, radical reaction on the substrate surface is promoted and the deposition rate of microcrystalline silicon can be increased. Further, a microwave plasma CVD apparatus which includes a plurality of microwave generating apparatuses and a plurality of dielectric plates can generate wide plasma stably. Therefore, a film having high uniformity in film quality can be formed even over a large substrate and mass productivity can be improved.

In addition, when the microcrystalline semiconductor and the amorphous semiconductor are successively formed in the same processing container, an interface with little distortion can be formed.

Note that in each of the manufacturing steps of the gate insulating film and the semiconductor films, when a protective film having a thickness of 500 to 2000 nm is formed on the inner wall of the reaction chamber, the cleaning treatment and the treatment for forming a protective film can be omitted.

Figure 2C:
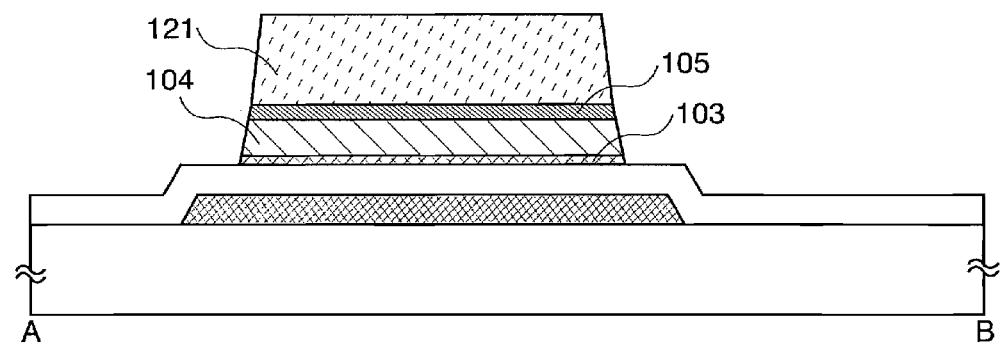
Figure 5B:
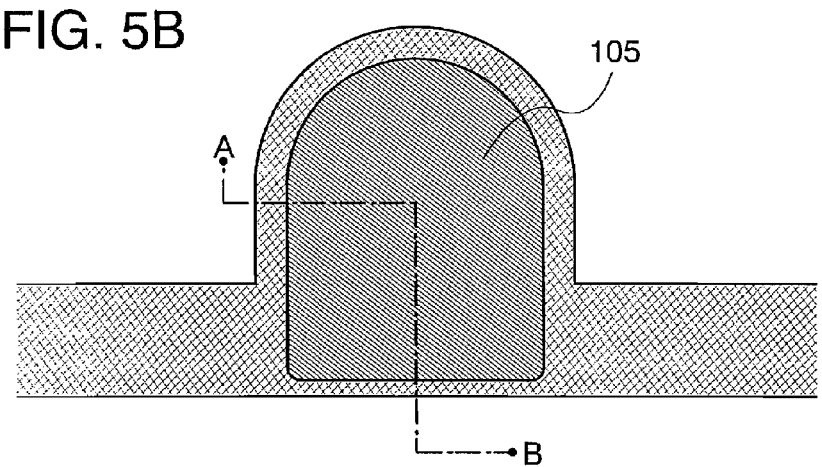

Next, a mask 121 is formed over the third semiconductor layer 105 to which an impurity which imparts one conductivity type is added, and the first semiconductor layer 103, the second semiconductor layer 104, and the third semiconductor layer 105 to which an impurity which imparts one conductivity type is added are etched using the mask 121 to be separated (see FIG. 2C). After that, the mask 121 is removed (see FIG. 5B).

The mask 121 is formed by a photolithography technique or an inkjet method.

Figure 2D:
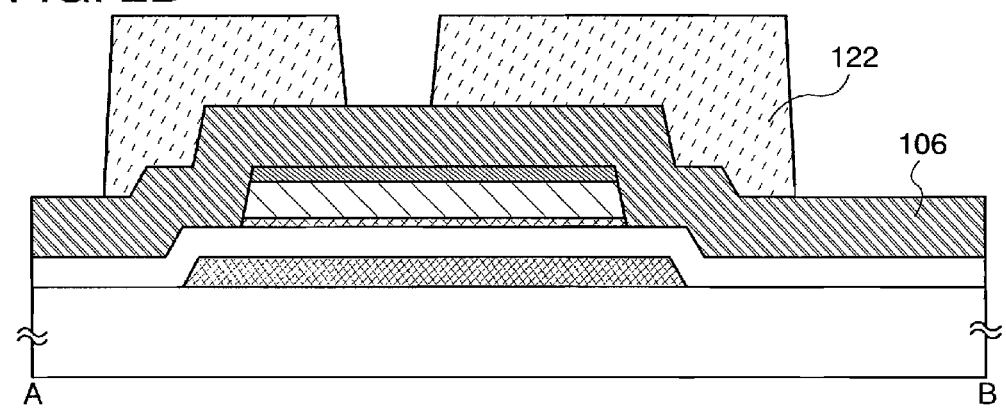

Next, the conductive film 106 is formed over the gate insulating film 102 and the third semiconductor layer 105 which remains after the etching, and a mask 122 is formed over the conductive film 106 (see FIG. 2D).

The conductive film 106 is preferably formed of a single-layer structure or a stacked-layer structure of aluminum, copper, or an aluminum alloy to which an element to improve heat resistance or to prevent a hillock, such as silicon, titanium, neodymium, scandium, or molybdenum is added. Alternatively, the conductive film 106 may have a stacked-layer structure where a layer on the side which is in contact with the third semiconductor layer 105 is formed using titanium, tantalum, molybdenum, tungsten, or nitride of any of these elements and aluminum or an aluminum alloy is formed thereover. Further alternatively, the conductive film 106 may have a stacked-layer structure where an upper side and a lower side of aluminum or an aluminum alloy is sandwiched with titanium, tantalum, molybdenum, tungsten, or nitride of any of these elements. For example, the conductive film 106 can have a three-layer structure in which a molybdenum film, an aluminum film, and a molybdenum film are sequentially stacked. Alternatively, the conductive film 106 can have a three-layer structure in which a titanium film, an aluminum film, and a titanium film are sequentially stacked.

The conductive film 106 is formed by a sputtering method or a vacuum evaporation method. Alternatively, the conductive film 106 may be formed by discharge of a conductive nanopaste of silver, gold, copper, or the like by using a screen printing method, an inkjet method, or the like and by baking thereof.

The mask 122 can be formed in a manner similar to that of the mask 121.

Note that although the case where the conductive film 106 is formed after the first semiconductor layer 103, the second semiconductor layer 104, and the third semiconductor layer 105 are patterned in FIG. 2C is described in this embodiment mode, the step of FIG. 2C may be omitted and the mask 122 may be formed after the first semiconductor layer 103, the second semiconductor layer 104, the third semiconductor layer 105, and the conductive film 106 are sequentially stacked in that order. In this case, since it is not necessary to form the mask 121, the process can be simplified.

Figure 3A:
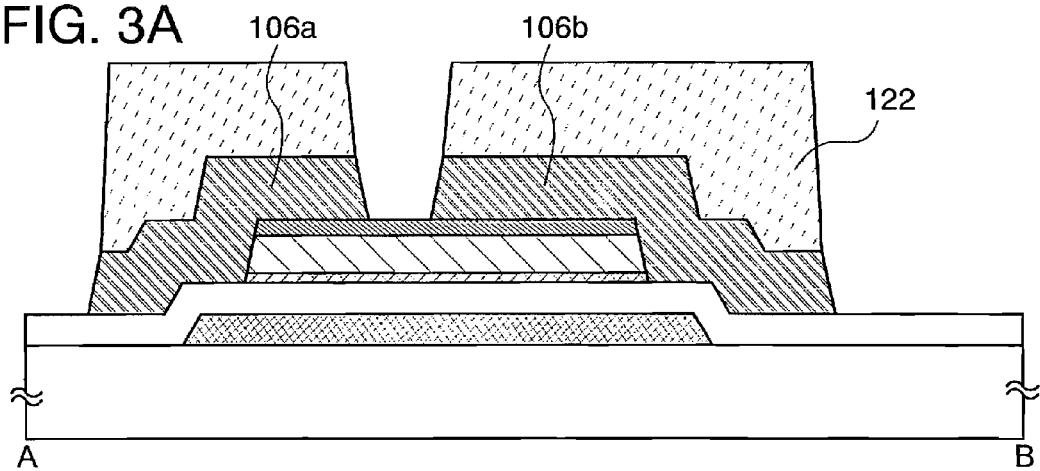
FIGS. 3A to 3C illustrate an example of a method for manufacturing a display device of the present invention.
Figure 5C:
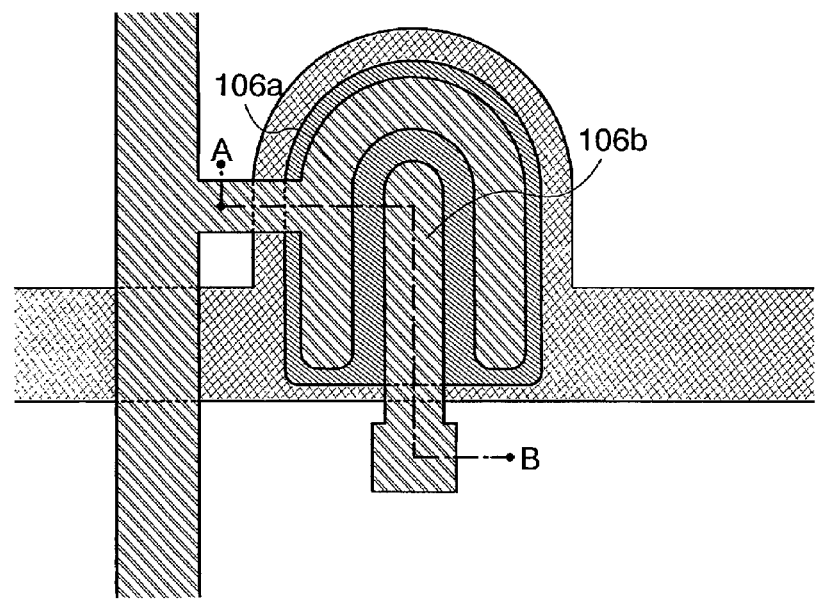

Next, the conductive film 106 is etched using the mask 122 to be separated, so that the source electrode 106*a* and the drain electrode 106*b* are formed (see FIG. 3A and FIG. 5C).

Figure 3B:
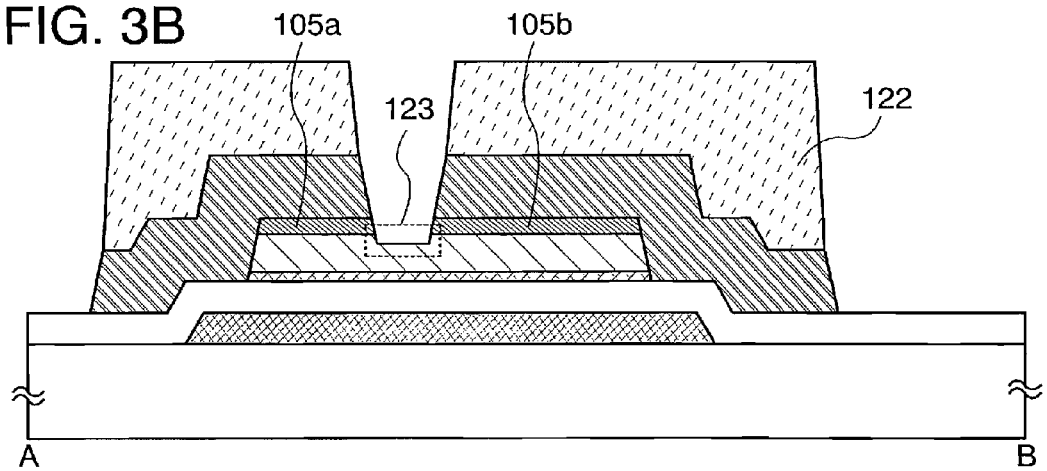
Figure 6A:
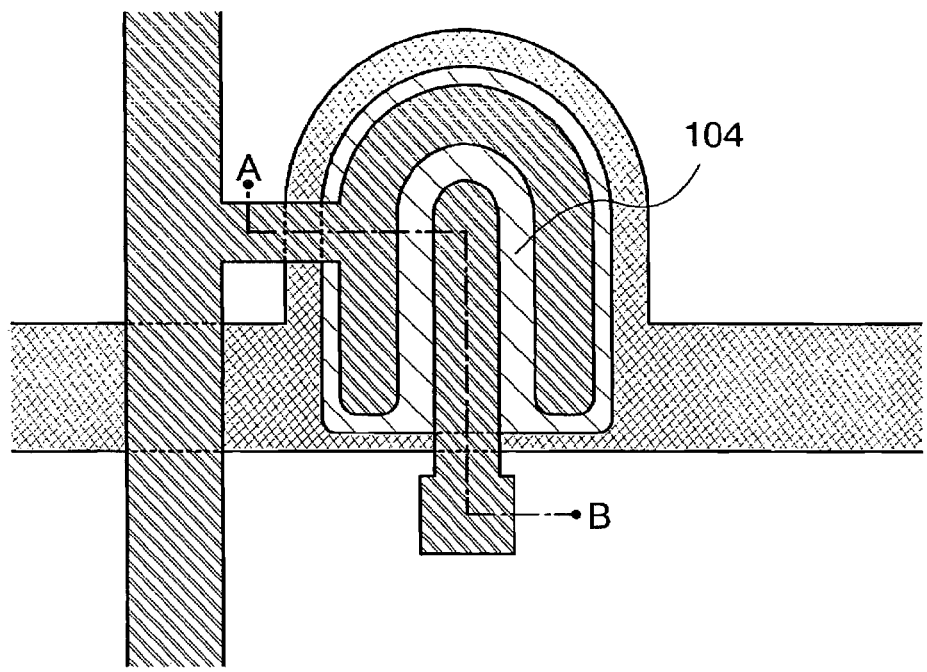
FIGS. 6A and 6B illustrate an example of a method for manufacturing a display device of the present invention.

Next, the third semiconductor layer 105 to which an impurity which imparts one conductivity type is added and the second semiconductor layer 104 which functions as a buffer layer are etched using the mask 122 to form the source region 105*a* and the drain region 105*b* (see FIG. 3B and FIG. 6A). Note that the second semiconductor layer 104 which functions as a buffer layer is etched only partly and covers the surface of the first semiconductor layer 103. Here, a depressed portion is formed in the surface of the second semiconductor layer 104 which is positioned between the source region 105*a* and the drain region 105*b*. Further, at this time, end portions of the source region 105*a* and the drain region 105*b* are almost aligned with end portions of the source electrode 106*a* and the drain electrode 106*b*.

Figure 3C:
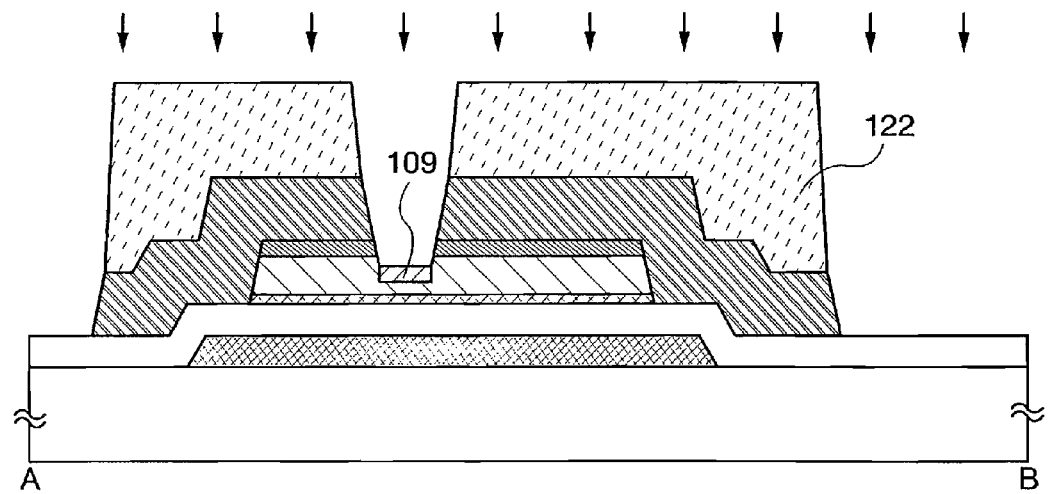
Figure 6B:
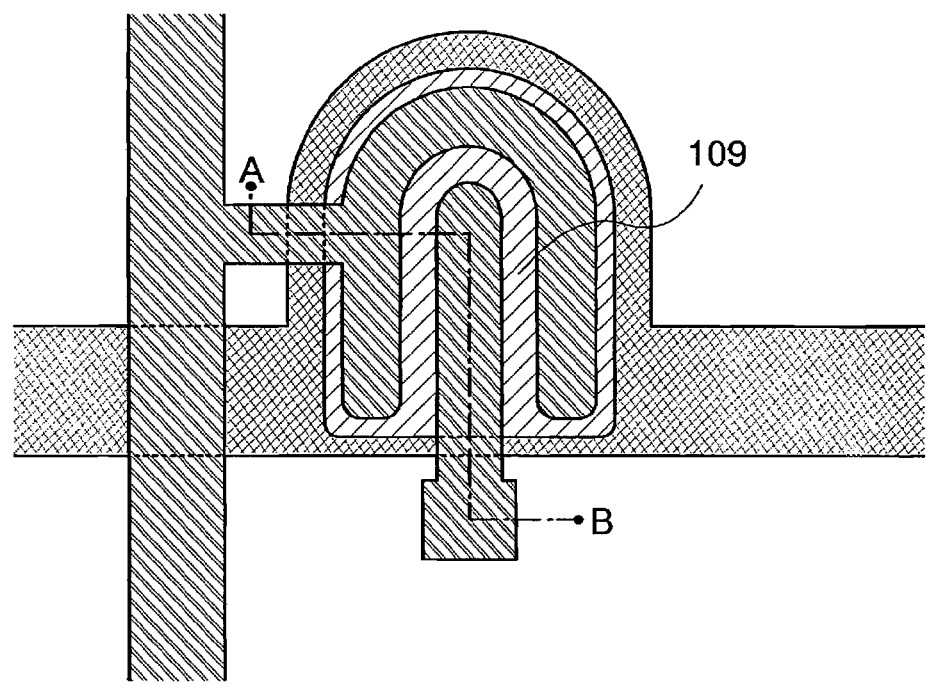

Next, an impurity element is introduced into the second semiconductor layer 104 by using the mask 122 to form the impurity region 109 in the second semiconductor layer 104 (see FIG. 3C and FIG. 6B).

An impurity element having a conductivity type different from the conductivity type of the source region 105*a* and the drain region 105*b* is used as the impurity element to be introduced. Here, a p-type impurity element is introduced. As the p-type impurity element, boron (B), aluminum (Al), gallium (Ga), or the like can be used. Here, boron (B) is introduced into the second semiconductor layer 104 so as to be contained at a concentration of $1 \times 10^{16}$ to $1 \times 10^{20}/cm^3$ to form the impurity region 109 which has p-type conductivity.

In addition, the impurity element is introduced at least on the top surface side of the second semiconductor layer 104, and it is preferable that the impurity element be introduced into the entire surface in a depth direction of the second semiconductor layer 104. Note that the threshold voltage of the thin film transistor may be controlled by introducing the impurity element into the first semiconductor layer 103, which is formed below the second semiconductor layer 104.

Figure 4A:
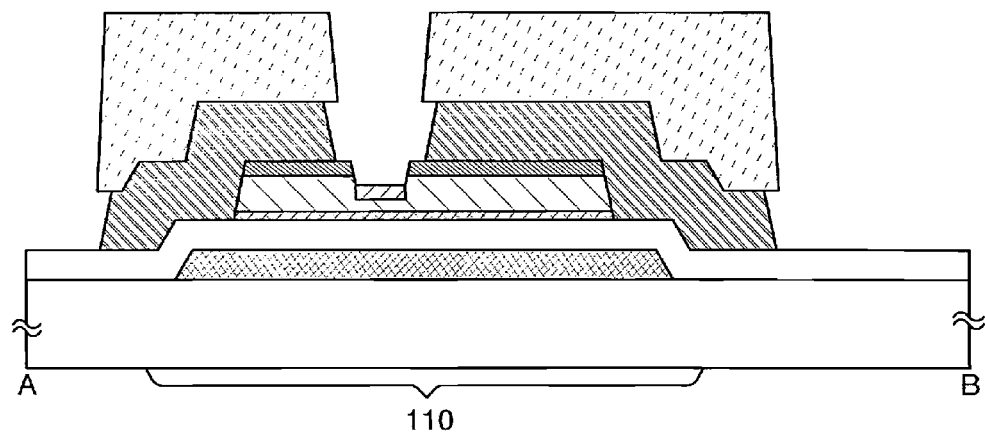
FIGS. 4A to 4C illustrate an example of a method for manufacturing a display device of the present invention.

Next, the source electrode 106*a* and the drain electrode 106*b* are etched partly (see FIG. 4A).

Here, when wet etching is performed using the mask 122, the end portions of the source electrode 106*a* and the drain electrode 106*b* are selectively etched. Accordingly, the end portions of the source electrode 106*a* and the drain electrode 106*b* are not aligned with the end portions of the source region 105*a* and the drain region 105*b* respectively, and the end portions of the source region 105*a* and the drain region 105*b* are formed outside the end portions of the source electrode 106*a* and the drain electrode 106*b* respectively.

Figure 7A:
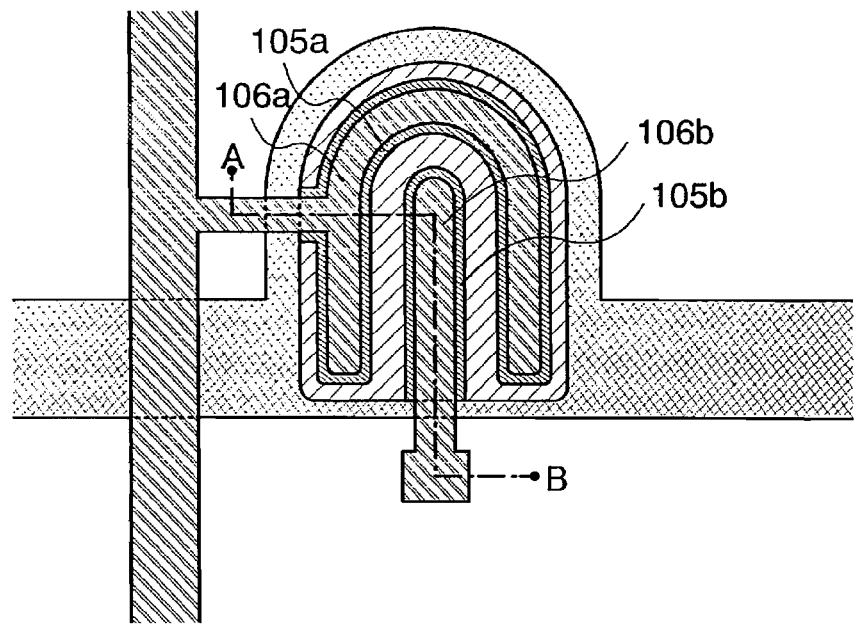
FIGS. 7A and 7B illustrate an example of a method for manufacturing a display device of the present invention.

After that, the mask 122 is removed (see FIG. 7A). In addition, the source electrode 106a and the drain electrode 106b also function as a source wiring and a drain wiring, respectively.

When the end portions of the source region 105a and the source electrode 106a are not aligned with the end portions of the drain region 105b and the drain electrode 106b respectively, a distance between the end portions of the source electrode 106a and the drain electrode 106b is long, so that generation of leakage current and short circuit between the source electrode 106a and the drain electrode 106b can be prevented. Further, when the end portions of the source region 105a and the source electrode 106a are not aligned with the end portions of the drain region 105b and the drain electrode 106b, an electric field does not concentrate on the end portions of the source electrode 106a and the drain electrode 106b and the end portions of the source region 105a and the drain region 105b. Thus, generation of leakage current between the gate electrode 101, and the source electrode 106a and the drain electrode 106b can be prevented. Therefore, a thin film transistor which has high reliability and high withstand voltage can be formed.

Through the above-described process, the channel-etched thin film transistor 110 can be formed.

As for the thin film transistor shown in this embodiment mode, a depressed portion (a groove) is formed in part of the second semiconductor layer 104, and regions other than the depressed portion are covered with the source region 105a and the drain region 105b. That is, due to a depressed portion 123 formed in the second semiconductor layer 104, a leak path between the source region 105a and the drain region 105b is long. Thus, leakage current between the source region 105a and the drain region 105b can be reduced. Further, when the depressed portion 123 is formed by etching the second semiconductor layer 104 partly, an etching residue which is generated in the formation step of the source region 105a and the drain region 105b can be removed. Accordingly, generation of leakage current (parasitic channel) between the source region 105a and the drain region 105b due the residue can be prevented.

The buffer layer is formed between the microcrystalline semiconductor which functions as a channel formation region, and the source region 105a and the drain region 105b. The surface of the microcrystalline semiconductor is covered with the buffer layer. The buffer layer, which has high resistance, is also formed between the microcrystalline semiconductor, and the source region 105a and the drain region 105b. Therefore, generation of leakage current in the thin film transistor can be reduced, and deterioration of the thin film transistor due to application of high voltage can be suppressed. Further, an amorphous semiconductor, the surface of which is terminated with hydrogen, is formed on the surface of the microcrystalline semiconductor. Thus, the microcrystalline semiconductor can be prevented from being oxidized, and an etching residue which is generated in the formation step of the source region 105a and the drain region 105b can be prevented from being mixed into the microcrystalline semiconductor.

Further, when the end portions of the source electrode and the drain electrode are not aligned with the end portions of the source region and the drain region, a distance between the end portions of the source electrode and the drain electrode is long. Therefore, generation of leakage current and short circuit between the source electrode and the drain electrode can be prevented.

Although the example in which the impurity element is introduced to form the impurity region 109 after the depressed portion 123 is formed in part of the second semiconductor layer 104 is described above, timing of introducing the impurity element is not limited to this. For example, after the conductive film 106 is separated to form the source electrode 106a and the drain electrode 106b (FIG. 3A), the impurity element may be introduced through the third semiconductor layer 105 by using the mask 122.

Alternatively, after the source electrode 106a and the drain electrode 106b are etched partly (FIG. 4A), the impurity element may be introduced by using the mask 122.

Figure 8A:
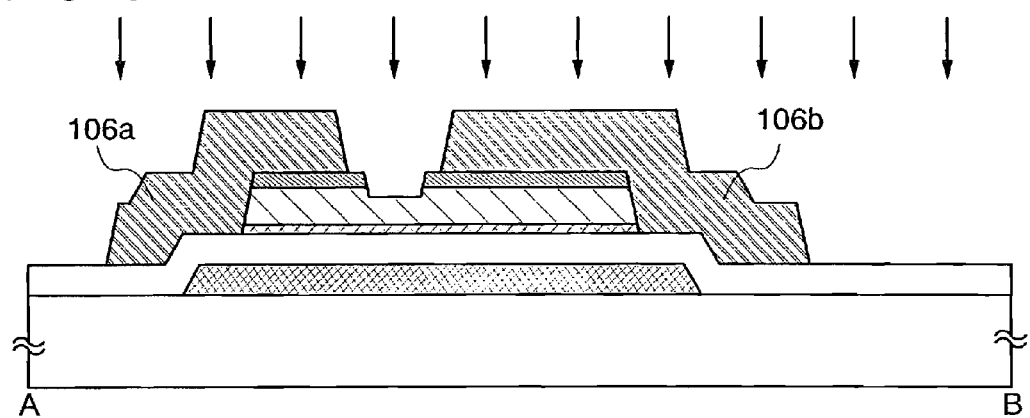
FIGS. 8A and 8B illustrate an example of a method for manufacturing a display device of the present invention.
Figure 8B:
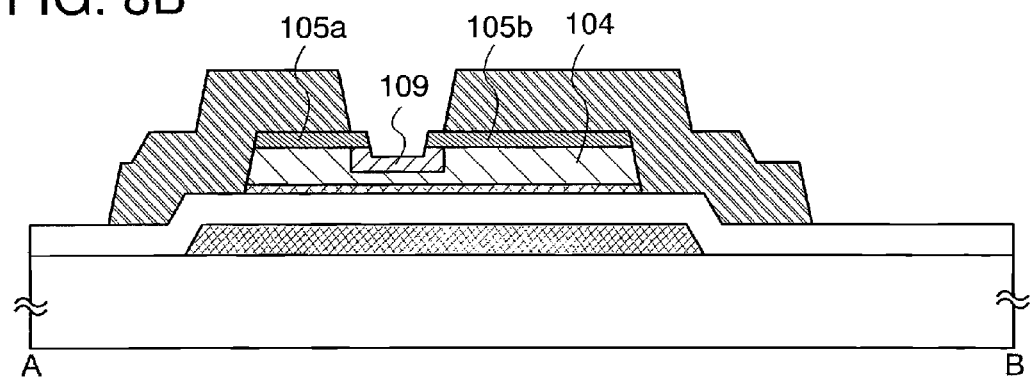

Alternatively, after the source electrode 106a and the drain electrode 106b are etched partly (FIG. 4A) and the mask 122 is removed, the impurity element may be introduced by using the source electrode 106a and the drain electrode 106b as a mask (see FIG. 8A). In this case, the impurity region 109 can also be formed in the second semiconductor layer 104 which is positioned below the end portions of the source region 105a and the drain region 105b (see FIG. 8B).

Figure 4B:
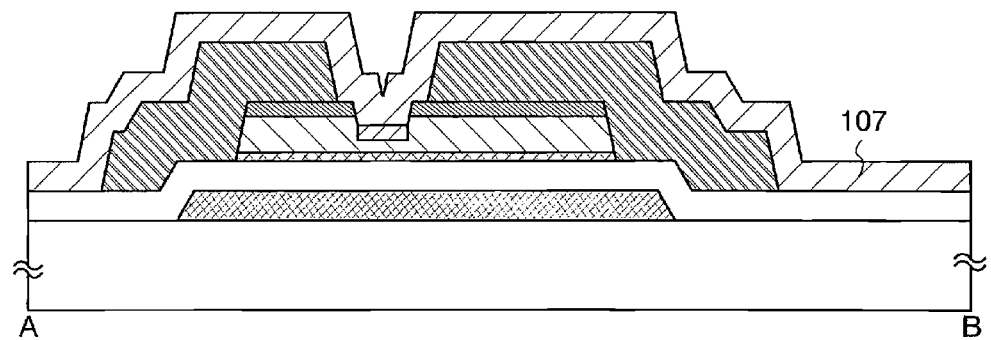

Next, the insulating film 107 is formed over the source electrode 106a and the drain electrode 106b, the source region 105a and the drain region 105b, the second semiconductor layer 104, the gate insulating film 102, and the like (see FIG. 4B). The insulating film 107 can be formed in a manner similar to that of the gate insulating film 102. Note that the insulating film 107 is provided in order to prevent entry of a contaminant impurity such as an organic substance or a metal substance floating in the atmosphere, or moisture and is preferably formed precisely.

Figure 4C:
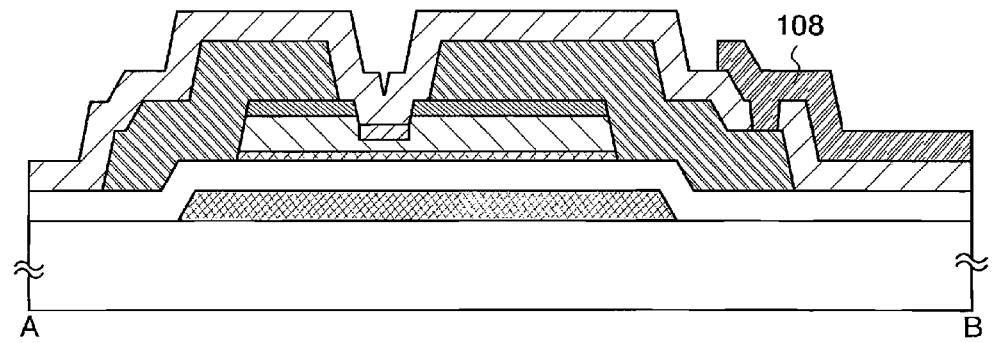
Figure 7B:
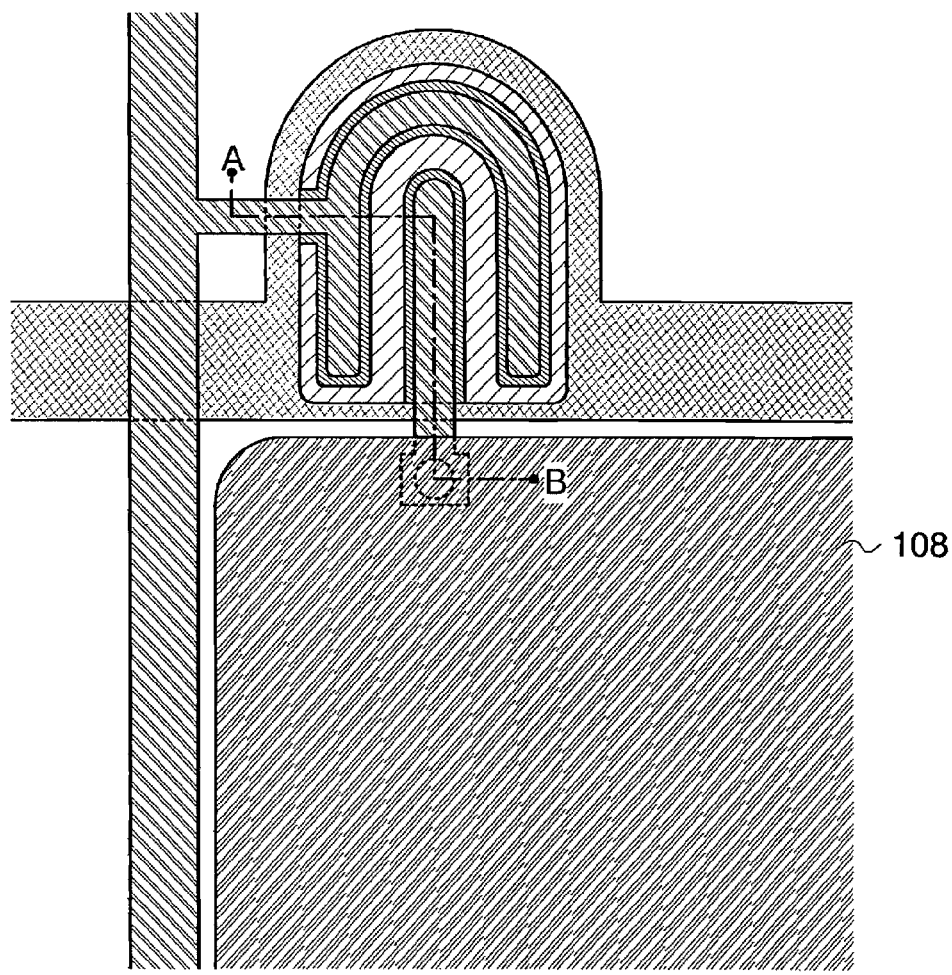

Next, a contact hole is formed in the insulating film 107, and the pixel electrode 108 which is in contact with the drain electrode 106b through the contact hole is formed (see FIG. 4C and FIG. 7B).

For the pixel electrode 108, a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added can be used.

Alternatively, the pixel electrode 108 can be formed using a conductive composition containing a conductive high-molecular compound (also referred to as a conductive polymer). It is preferable that the pixel electrode formed using the conductive composition have a sheet resistance of 10000 Ω/square or less and a light transmittance of 70% or more at a wavelength of 550 nm. The sheet resistance of the pixel electrode is preferably lower. In addition, it is preferable that the resistivity of the conductive high-molecular compound contained in the conductive composition be 0.1 Ω·cm or less.

Note that as the conductive high-molecular compound, a so-called π electron conjugated conductive high-molecular compound can be used. Examples of the conductive high-molecular compound are polyaniline and its derivatives, polypyrrole and its derivatives, polythiophene and its derivatives, copolymers of two or more kinds of them, and the like.

Through the above-described process, a display device having the thin film transistor 110 in a pixel portion can be formed.

In the thin film transistor 110 shown in this embodiment mode, the number of manufacturing steps is small, so that cost can be reduced. When the first semiconductor layer 103 which functions as a channel formation region is formed using a microcrystalline semiconductor, a field-effect mobility of 1 to 20 $cm^2/V \cdot sec$ can be obtained. Accordingly, although an example in which the thin film transistor 110 is used as a switching element of a pixel in the pixel portion is shown in this embodiment mode, the present invention is not limited to this. The thin film transistor 110 can be used as an element included in a scan line (a gate line) side driver circuit or the like.

This embodiment mode can be combined with any of the structures described in other embodiment modes.

(Embodiment Mode 3)

In this embodiment mode, a display device including a thin film transistor which is different from the thin film transistors in the aforementioned embodiment modes is described with reference to FIG. 18.

Figure 18:
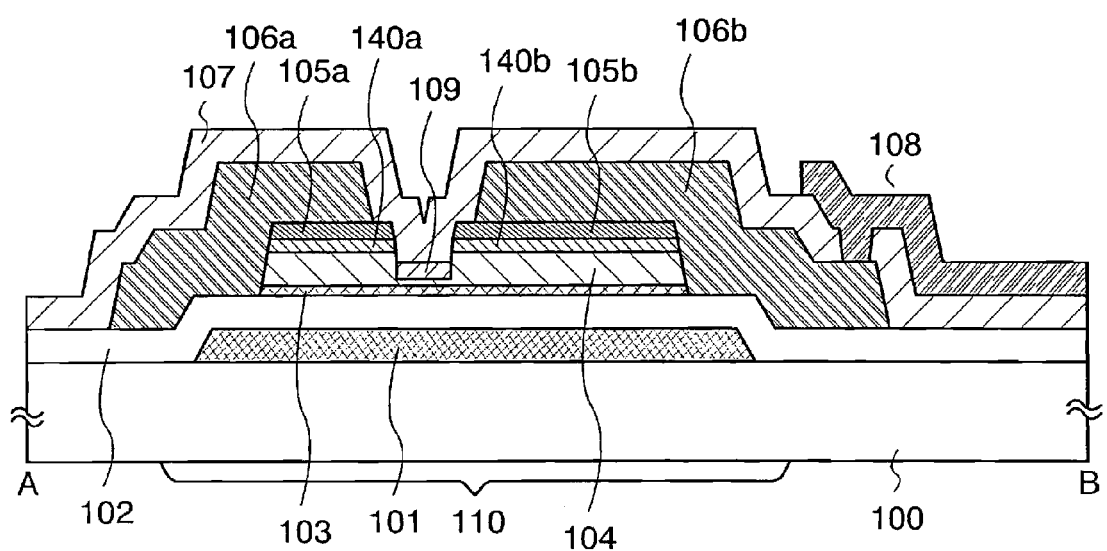
FIG. 18 illustrates an example of a display device of the present invention.

Comparing the structure shown in FIGS. 1A and 1B, the thin film transistor 110 shown in this embodiment mode includes a semiconductor layer 140*a* containing an impurity element at a low concentration, which is provided between the second semiconductor layer 104 and the source region 105*a*, and a semiconductor layer 140*b* containing an impurity element at a low concentration, which is provided between the second semiconductor layer 104 and the drain region 105*b* (see FIG. 18). When the semiconductor layers 140*a* and 140*b* are provided, electric field concentration between the second semiconductor layer 104 and the source region 105*a* or between the second semiconductor layer 104 and the drain region 105*b* can be relieved.

In FIG. 18, when the thin film transistor is an n-channel thin film transistor, the second semiconductor layer 104 may be formed using an intrinsic semiconductor layer and the semiconductor layers 140*a* and 140*b* which can function as LDD regions may be formed using an amorphous semiconductor (e.g., an amorphous semiconductor film) which has weaker n-type conductivity than the source region 105*a* and the drain region 105*b*. Alternatively, when the thin film transistor is a p-channel thin film transistor, the second semiconductor layer 104 may be formed using an intrinsic semiconductor layer and the semiconductor layers 140*a* and 140*b* which can function as LDD regions may be formed using an amorphous semiconductor (e.g., an amorphous semiconductor film) which has weaker p-type conductivity than the source region 105*a* and the drain region 105*b*.

This embodiment mode can be combined with any of the structures described in other embodiment modes.

(Embodiment Mode 4)

In this embodiment mode, a display device including a thin film transistor which is different from the thin film transistors in the aforementioned embodiment modes is described with reference to drawings. Specifically, although channel-etched thin film transistors are shown in the aforementioned embodiment modes, a structure where a protective layer 160 is provided (a channel protective type) may be used (see FIG. 15).

In the structure shown in FIG. 15, the impurity region 109 is formed below the protective layer 160. When the second semiconductor layer 104 where the impurity region 109 is provided over the first semiconductor layer 103 which functions as a channel formation region is provided as a buffer layer as described in Embodiment Mode 1, a display device including a thin film transistor with high electric characteristics and high reliability can be manufactured.

Figure 15:
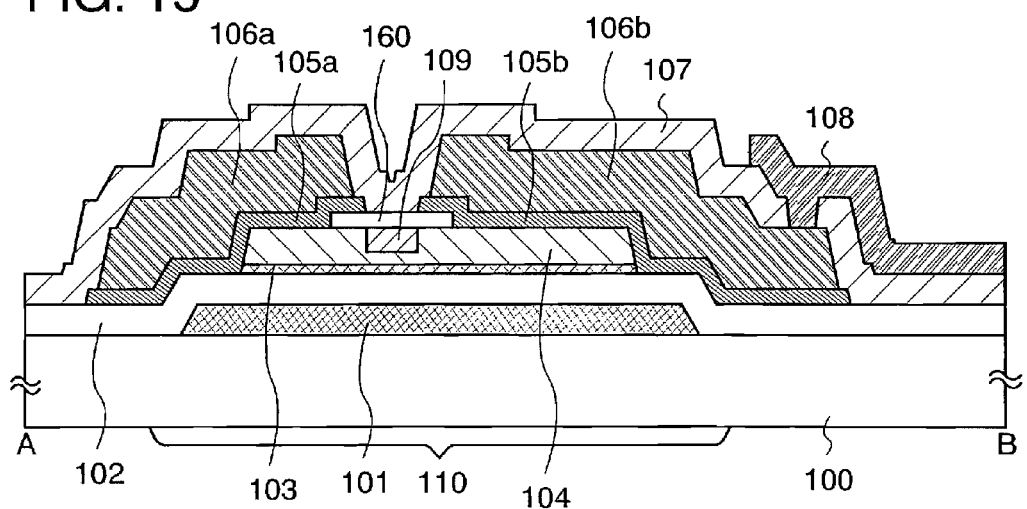
FIG. 15 illustrates an example of a display device of the present invention.

Next, a method for manufacturing the channel protective thin film transistor shown in FIG. 15 is briefly described with reference to drawings.

First, after the gate electrode 101 is formed over the substrate 100, the gate insulating film 102, the first semiconductor layer 103 having a microcrystalline semiconductor, and the second semiconductor layer 104 having an amorphous semiconductor are stacked over the gate electrode 101. Subsequently, the protective layer 160 is selectively formed over the second semiconductor layer 104 (see FIG. 16A).

The protective layer 160 can be formed using an inorganic material (e.g., silicon oxide, silicon nitride, silicon oxynitride, or silicon nitride oxide). Alternatively, a photosensitive or non-photosensitive organic material (organic resin material) (e.g., polyimide, acrylic, polyamide, polyimideamide, resist, or benzocyclobutene), a film made of plural kinds of these materials, or a stacked-layer of them can be used. Further alternatively, siloxane may be used. As the manufacturing method, a chemical vapor deposition method such as a plasma CVD method or a thermal CVD method, or a sputtering method can be used. Alternatively, a coating method such as a spin coating method, or a droplet discharge method, each of which is a wet method, or a printing method (e.g., screen printing or offset printing by which a pattern is formed) can be used. The protective layer 160 may be formed and then patterned by etching, or may be formed selectively by a droplet discharge method or the like.

Next, the mask 121 is formed over the protective layer 160 and the second semiconductor layer 104, and the first semiconductor layer 103 and the second semiconductor layer 104 are etched using the mask 121 to be separated (see FIG. 16B). After that, the mask 121 is removed.

Next, the third semiconductor layer 105 to which an impurity which imparts one conductivity type is added and the conductive film 106 are stacked in that order over the gate insulating film 102, the second semiconductor layer 104, and the protective layer 160 (see FIG. 16C).

Figure 17A:
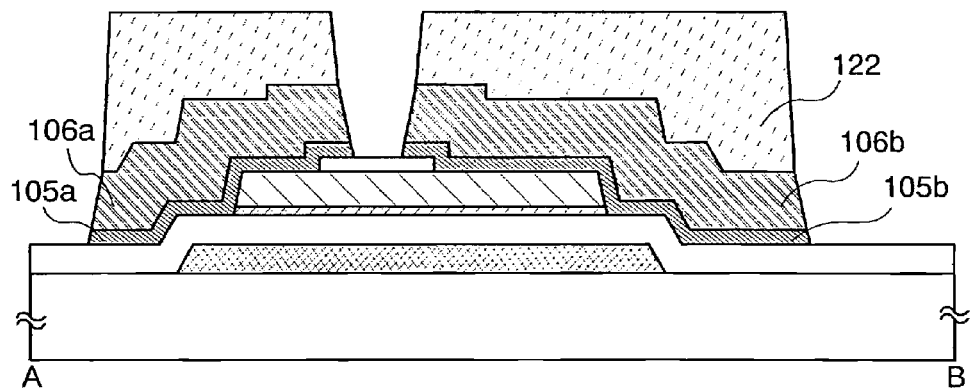
FIGS. 17A to 17C illustrate an example of a method for manufacturing a display device of the present invention.

Next, the mask 122 is formed over the conductive film 106, and the third semiconductor layer 105 and the conductive film 106 are etched using the mask 122 to be separated, so that the source region 105*a* and the drain region 105*b*, and the source electrode 106*a* and the drain electrode 106*b* are formed (see FIG. 17A). At this time, the second semiconductor layer 104 is not etched because of the existence of the protective layer 160.

Figure 17B:
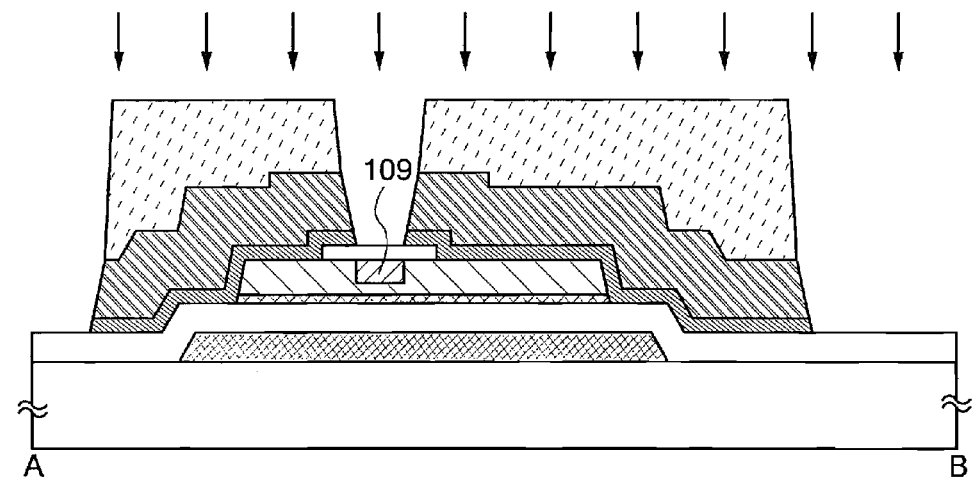

Next, an impurity element is introduced into the second semiconductor layer 104 by using the mask 122 to form the impurity region 109 in the second semiconductor layer 104 (see FIG. 17B). Here, the impurity element is introduced into the second semiconductor layer 104 through the protective layer 160.

Figure 17C:
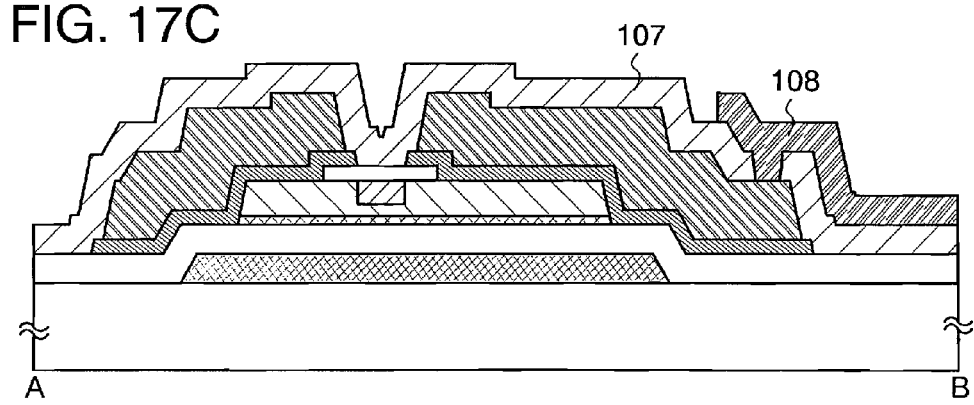

After that, through the steps described with reference to FIGS. 4A to 4C, a display device including a channel protective thin film transistor can be formed (see FIG. 17C).

Note that this embodiment mode can be combined with any of the structures described in other embodiment modes.

(Embodiment Mode 5)

Figure 11A:
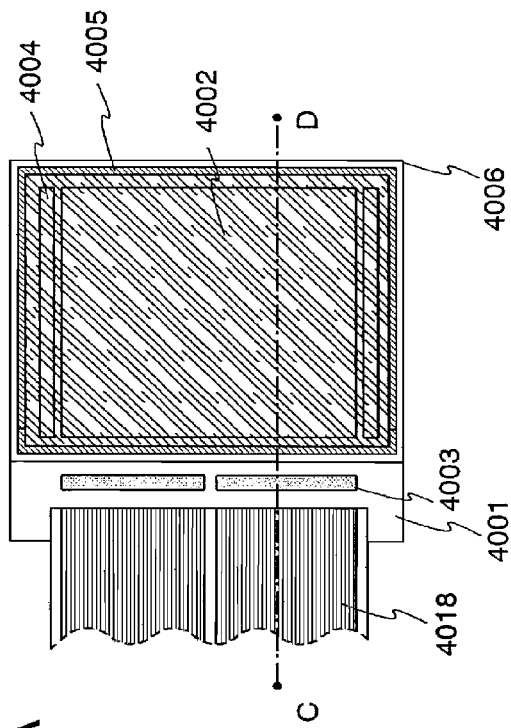
FIGS. 11A and 11B illustrate an example of a display device of the present invention.
Figure 11B:
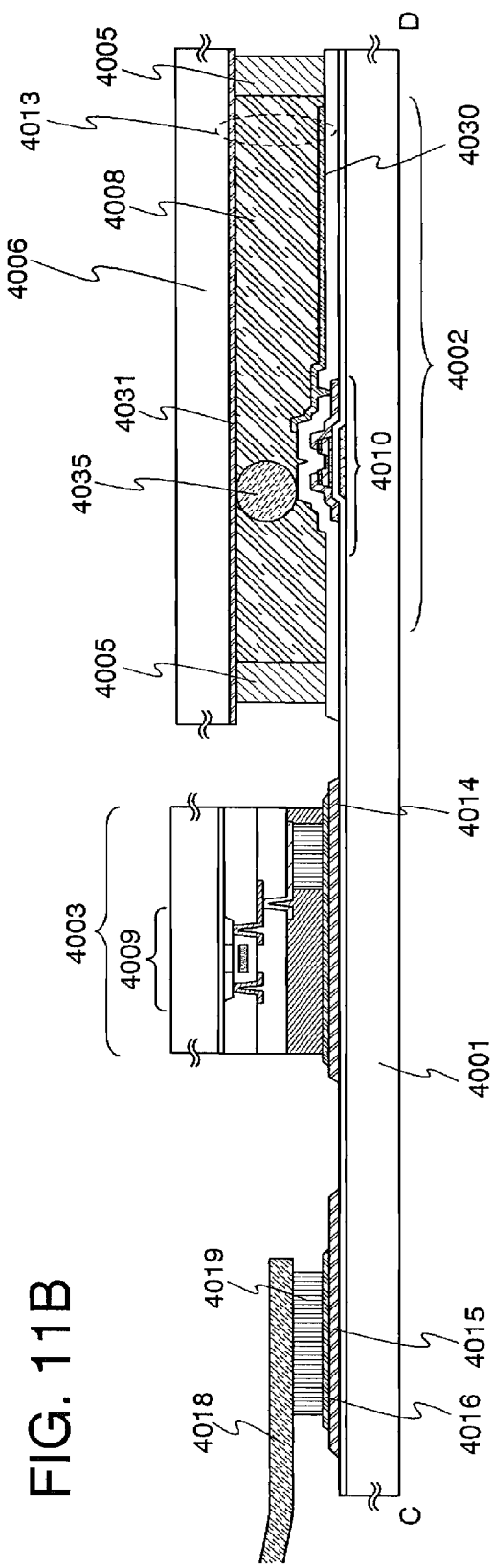

In this embodiment mode, a liquid crystal display panel is described with reference to FIGS. 11A and 11B as one mode of a display device having the thin film transistors described in the aforementioned embodiment modes. FIG. 11A is a top view of a panel, in which a thin film transistor 4010 and a liquid crystal element 4013 which are formed over a first substrate 4001 are sealed between the first substrate 4001 and a second substrate 4006 by a sealant 4005. FIG. 11B shows a cross section taken along the line C-D in FIG. 11A.

In the liquid crystal display panel shown in this embodiment mode, the sealant 4005 is provided so as to surround a pixel portion 4002 and a scan line driver circuit 4004 which are provided over the first substrate 4001. The second substrate 4006 is provided over the pixel portion 4002 and the scan line driver circuit 4004. Thus, the pixel portion 4002 and the scan line driver circuit 4004 are sealed together with a liquid crystal 4008 by the first substrate 4001, the sealant 4005, and the second substrate 4006.

Further, a signal line driver circuit 4003 which includes a thin film transistor 4009 formed using a polycrystalline semiconductor film is mounted on a region over the first substrate 4001, which is different from the region surrounded by the sealant 4005. Note that although an example in which the signal line driver circuit 4003 which includes the thin film transistor 4009 formed using a polycrystalline semiconductor film is attached to the first substrate 4001 is described in this embodiment mode, the signal line driver circuit 4003 may be formed using a transistor using a single-crystal semiconductor and attached to the first substrate 4001.

Each of the pixel portion 4002 and the scan line driver circuit 4004 which are provided over the first substrate 4001 includes a plurality of thin film transistors. FIG. 11B illustrates the thin film transistor 4010 included in the pixel portion 4002. The thin film transistor 4010 corresponds to the thin film transistor described in Embodiment Modes 1 and 2. In addition, the thin film transistor included in the scan line driver circuit 4004 can have a structure which is similar to that of the thin film transistor 4010.

A pixel electrode 4030 is electrically connected to the thin film transistor 4010. Further, a counter electrode 4031 of the liquid crystal element 4013 is formed on the second substrate 4006. A portion where the pixel electrode 4030, the counter electrode 4031, and the liquid crystal 4008 overlap with each other corresponds to the liquid crystal element 4013.

Note that as each of the first substrate 4001 and the second substrate 4006, glass, metal (typically stainless steel), ceramics, or plastics can be used. As plastics, an FRP (fiberglass-reinforced plastics) plate, a PVF (polyvinyl fluoride) film, a polyester film, or an acrylic resin film can be used. Alternatively, a sheet in which aluminum foil is interposed between PVF films or polyester films can be used.

A spherical spacer 4035 is provided for controlling a distance (a cell gap) between the pixel electrode 4030 and the counter electrode 4031. Note that instead of the spherical spacer 4035, a spacer obtained by selectively etching an insulating film may be used.

A variety of signals and potentials supplied to the scan line driver circuit 4004 or the pixel portion 4002, and the signal line driver circuit 4003 which is formed separately are supplied from an FPC 4018 through the lead wirings 4014 and 4015.

In this embodiment mode, a connection terminal 4016 is formed using the same conductive film as the pixel electrode 4030. Further, the lead wirings 4014 and 4015 are formed using the same conductive film as a source electrode and a drain electrode of the thin film transistor 4010.

The connection terminal 4016 is electrically connected to a terminal included in the FPC 4018 through an anisotropic conductive film 4019.

Note that although not shown, the liquid crystal display device shown in this embodiment mode includes alignment films and polarizing plates, and may also include a color filter or a shielding film.

Note that although FIGS. 11A and 11B show an example in which the signal line driver circuit 4003 is formed separately and mounted on the first substrate 4001, the present invention is not limited to this structure. The scan line driver circuit may be separately formed and mounted on a substrate, or only part of the signal line driver circuit or part of the scan line driver circuit may be separately formed and mounted on a substrate.

The liquid crystal display device described in this embodiment mode can be a TN (twisted nematic)-mode liquid crystal display device, a VA (vertical alignment)-mode liquid crystal display device, or a horizontal electric field liquid crystal display device.

A VA mode of a liquid crystal display device is a kind of mode in which alignment of liquid crystal molecules of a liquid crystal panel is controlled. A VA mode is a mode in which liquid crystal molecules are aligned vertically to a panel surface when voltage is not applied. In particular, in this embodiment mode, it is devised that a pixel is divided into several regions (subpixels) so that molecules are aligned in different directions. This is referred to as domain multiplication or multi-domain.

A horizontal electric field mode is a mode in which liquid crystals are driven to express grayscale by horizontally applying an electric field to liquid crystal molecules in a cell. With this mode, the viewing angle can be widened to approximately 180 degrees.

This embodiment mode can be combined with any of the structures described in other embodiment modes.

(Embodiment Mode 6)

Figure 12A:
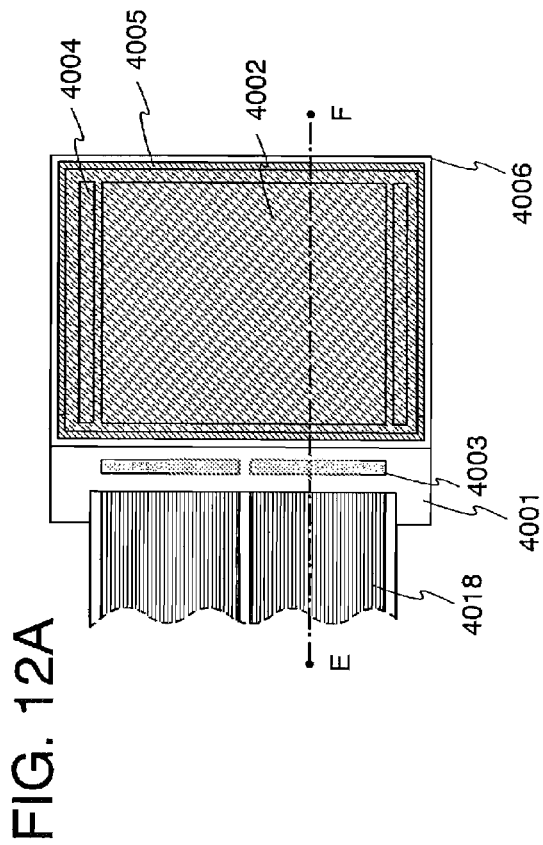
FIGS. 12A and 12B illustrate an example of a display device of the present invention.
Figure 12B:
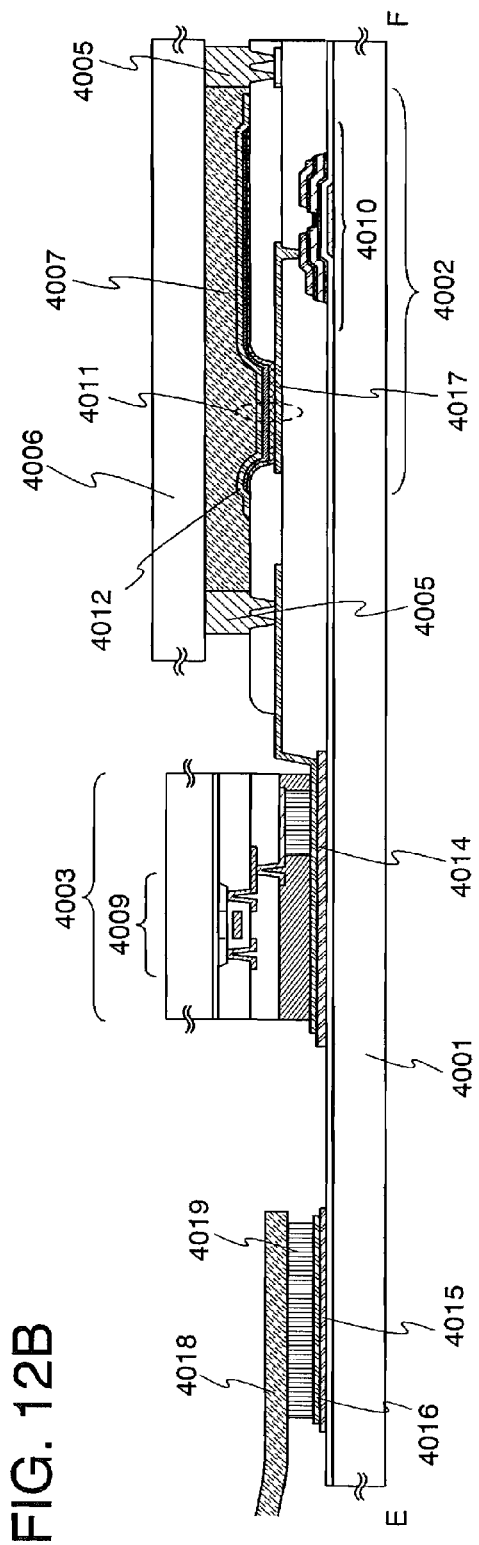

In this embodiment mode, a light-emitting display panel is described with reference to FIGS. 12A and 12B as one mode of a light-emitting device having the thin film transistors described in the aforementioned embodiment modes. FIG. 12A is a top view of a panel, in which the thin film transistor 4010 and the light-emitting element 4011 which are formed over the first substrate 4001 are sealed between the first substrate 4001 and the second substrate 4006 by the sealant 4005. FIG. 12B shows a cross section taken along the line E-F in FIG. 12A.

A light-emitting element utilizing electroluminescence is used for the description in this embodiment mode. Light-emitting elements utilizing electroluminescence are classified according to whether a light-emitting material is an organic compound or an inorganic compound. In general, the former is referred to as organic EL elements and the latter as inorganic EL elements.

In the light-emitting display panel shown in this embodiment mode, the sealant 4005 is provided so as to surround the pixel portion 4002 and the scan line driver circuit 4004 which are provided over the first substrate 4001. The second substrate 4006 is provided over the pixel portion 4002 and the scan line driver circuit 4004. Thus, the pixel portion 4002 and the scan line driver circuit 4004 are sealed together with a filler 4007 by the first substrate 4001, the sealant 4005, and the second substrate 4006.

Further, the signal line driver circuit 4003 which includes the thin film transistor 4009 formed using a polycrystalline semiconductor film is mounted on a region over the first substrate 4001, which is different from the region surrounded by the sealant 4005. Note that although an example in which the signal line driver circuit 4003 which includes the thin film transistor 4009 formed using a polycrystalline semiconductor film is attached to the first substrate 4001 is described in this embodiment mode, the signal line driver circuit may be formed using a transistor using a single-crystal semiconductor and attached to the first substrate 4001.

Each of the pixel portion 4002 and the scan line driver circuit 4004 which are provided over the first substrate 4001 includes a plurality of thin film transistors. FIG. 12B illustrates the thin film transistor 4010 included in the pixel portion 4002. The thin film transistor 4010 corresponds to the thin film transistor described in Embodiment Modes 1 and 2. In addition, the thin film transistor included in the scan line driver circuit 4004 can have a structure which is similar to that of the thin film transistor 4010.

A pixel electrode 4017 included in the light-emitting element 4011 is electrically connected to the source electrode or the drain electrode of the thin film transistor 4010. The structure of the light-emitting element 4011 can be changed as appropriate in accordance with a direction of light extracted from the light-emitting element 4011, polarity of the thin film transistor 4010, or the like. Note that the light-emitting element 4011 is composed of the pixel electrode 4017, an EL layer, and a transparent conductive film 4012.

Although a variety of signals and potentials supplied to the pixel portion 4002 or the scan line driver circuit 4004, and the signal line driver circuit 4003 which is formed separately are not illustrated in the cross-sectional view shown in FIG. 12B, the variety of signals and potentials are supplied from the FPC 4018 through the lead wirings 4014 and 4015.

In this embodiment mode, the connection terminal 4016 is formed using the same conductive film as the pixel electrode 4017 included in the light-emitting element 4011. Further, the lead wirings 4014 and 4015 are formed using the same conductive film as the source electrode and the drain electrode of the thin film transistor 4010.

The connection terminal 4016 is electrically connected to a terminal included in the FPC 4018 through the anisotropic conductive film 4019.

Note that the substrate which is in a direction from which light from the light-emitting element 4011 is extracted is formed using a light-transmitting material. Since light is extracted from the second substrate 4006 side in this embodiment mode, the second substrate 4006 is formed using a light-transmitting material such as a glass substrate, a plastic substrate, a polyester film, or an acrylic film.

As the filler 4007, as well as an inert gas such as nitrogen or argon, an ultraviolet curable resin, a thermosetting resin, or the like can be used. For example, PVC (polyvinyl chloride), acrylic, polyimide, an epoxy resin, a silicone resin, PVB (polyvinyl butyral), or EVA (ethylene vinyl acetate) can be used.

If necessary, an optical film such as a polarizing plate, a circular polarizing plate (including an oval polarizing plate), a retardation plate (a $\lambda/4$ plate or a $\lambda/2$ plate), or a color filter may be provided as appropriate over a light-emitting surface of the light-emitting element. Further, an anti-reflection film may be provided over a polarizing plate or a circular polarizing plate. For example, anti-glare treatment can be performed by which reflected light can be diffused by unevenness of a surface and reflection can be reduced.

Note that although FIGS. 12A and 12B shows an example in which the signal line driver circuit 4003 is formed separately and mounted on the first substrate 4001, this embodiment mode is not limited to this structure. The scan line driver circuit may be separately formed and mounted on a substrate, or only part of the signal line driver circuit or part of the scan line driver circuit may be separately formed and mounted on a substrate.

This embodiment mode can be combined with any of the structures described in other embodiment modes.
(Embodiment Mode 7)

A display device or the like obtained by using the present invention can be used for an active matrix display device module. That is, the present invention can be applied to any electronic device in which such an active matrix display device module is incorporated in a display portion.

Examples of such electronic devices are cameras such as a video camera and a digital camera, a head-mounted display (a goggle-type display), a car navigation system, a projector, a car stereo, a personal computer, a portable information terminal (e.g., a mobile computer, a mobile phone, or an electronic book), and the like. FIGS. 13A to 13D show examples such electronic devices.

Figure 13A:
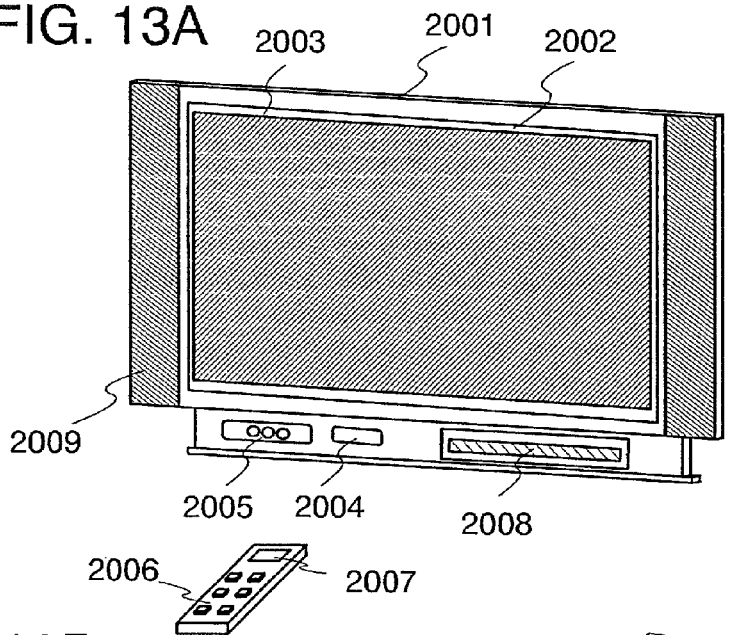
FIGS. 13A to 13D each illustrate a usage example of an application of a display device of the present invention.

FIG. 13A shows a television set. A television set can be completed when a display module is incorporated in a housing, as shown in FIG. 13A. A display panel on which an FPC is mounted is also referred to as a display module. A main screen 2003 is formed using the display module, and a speaker portion 2009, operation switches, and the like are provided as its accessory equipment. Thus, a television set can be completed.

As shown in FIG. 13A, a display panel 2002 using a display element is incorporated in a housing 2001. When a receiver 2005 is used, including reception of general TV broadcast, communication of information can also be performed in one way (from a transmitter to a receiver) or in two ways (between a transmitter and a receiver or between receivers) by connection to a wired or wireless communication network through a modem 2004. The television set can be operated by switches incorporated in the housing or by a remote controller 2006 separated from the main body. A display portion 2007 displaying information to be output may also be provided in this remote controller 2006.

In addition, in the television set, a structure for displaying a channel, sound volume, or the like may be added by forming a subscreen 2008 with a second display panel in addition to the main screen 2003. In this structure, the main screen 2003 may be formed using a light-emitting display panel superior in the viewing angle, and the subscreen 2008 may be formed using a liquid crystal display panel capable of displaying images with low power consumption. Alternatively, in order to prioritize low power consumption, a structure in which the main screen 2003 is formed using a liquid crystal display panel, the subscreen 2008 is formed using an EL display panel, and the subscreen 2008 can flash on and off may be employed.

Figure 14:
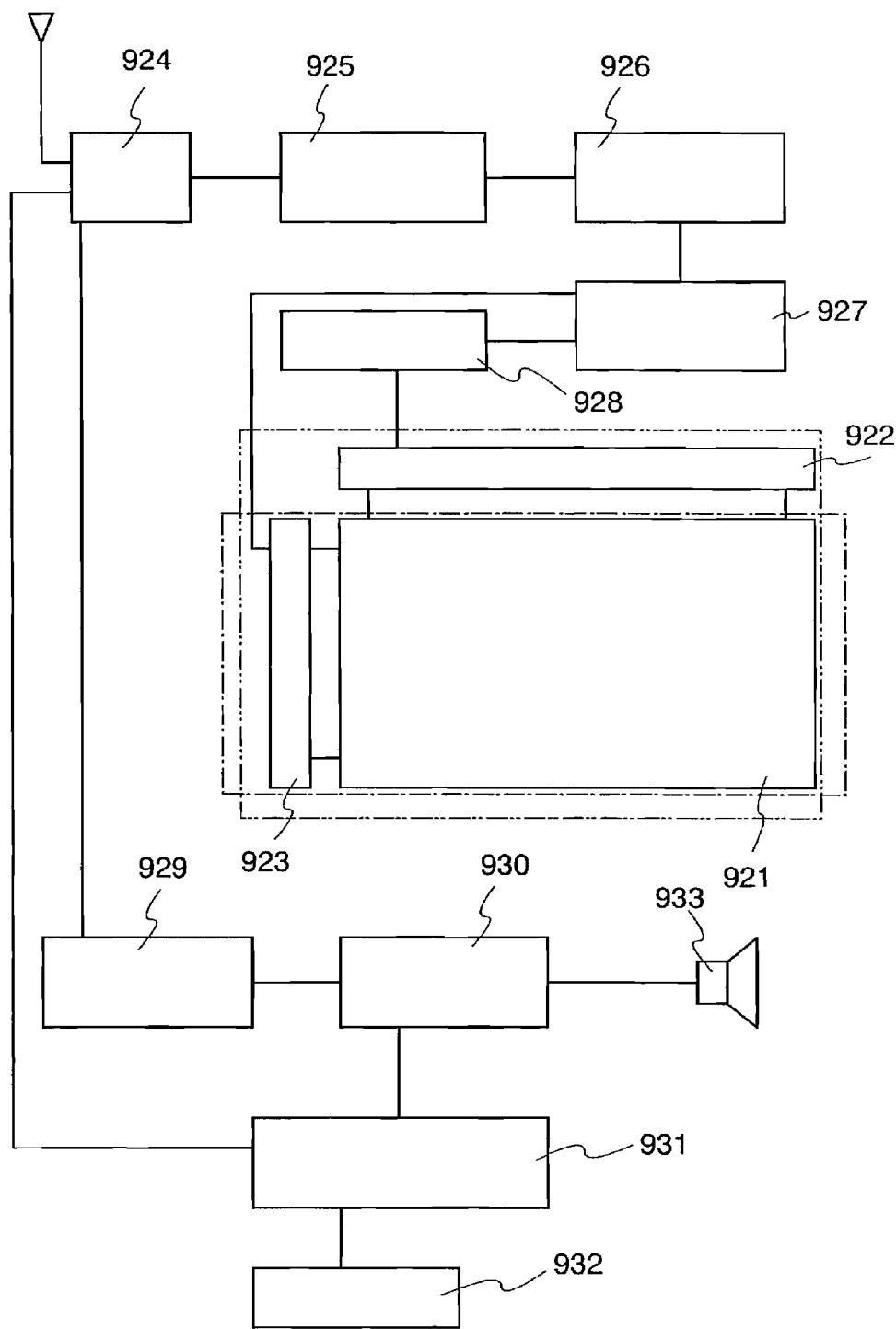
FIG. 14 illustrates a usage example of a display device of the present invention.

FIG. 14 is a block diagram showing a main structure of a television set. A pixel portion 921 is included in a display panel. A signal line driver circuit 922 and a scan line driver circuit 923 may be mounted on the display panel by a COG method.

As structures of other external circuits, a video signal amplifier circuit 925 amplifying a video signal among signals received by a tuner 924, a video signal processing circuit 926 converting signals output from the video signal amplifier circuit 925 into chrominance signals corresponding to respective colors of red, green, and blue, a control circuit 927 for converting the video signal into a signal which meets input specifications of a driver IC, and the like are provided on an input side of the video signal. The control circuit 927 outputs signals to both a scan line side and a signal line side. In the case of digital driving, a signal dividing circuit 928 may be provided on the signal line side and an input digital signal may be divided into m pieces to be supplied.

Among the signals received by the tuner 924, an audio signal is transmitted to an audio signal amplifier circuit 929, and the output thereof is supplied to a speaker 933 through an audio signal processing circuit 930. A control circuit 931 receives control information on a receiving station (receiving frequency) or sound volume from an input portion 932 and transmits the signal to the tuner 924 or the audio signal processing circuit 930.

Needless to say, the present invention is not limited to the television set, and can be applied to various uses as a large display medium such as an information display board at a train station, an airport, or the like, or an advertisement display board on the street, as well as a monitor of a personal computer.

Figure 13B:
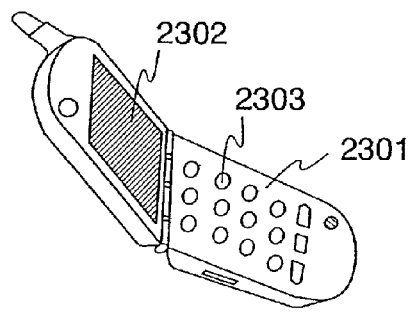

FIG. 13B shows an example of a mobile phone 2301. The mobile phone 2301 includes a display portion 2302, an operation portion 2303, and the like. When the display device described in any of the aforementioned embodiment modes is applied to the display portion 2302, mass productivity can be improved.

Figure 13C:
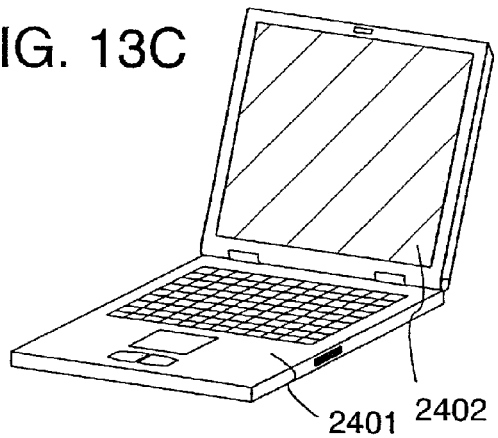

A mobile computer shown in FIG. 13C includes a main body 2401, a display portion 2402, and the like. When the display device described in any of the aforementioned embodiment modes is applied to the display portion 2402, mass productivity can be improved.

Figure 13D:
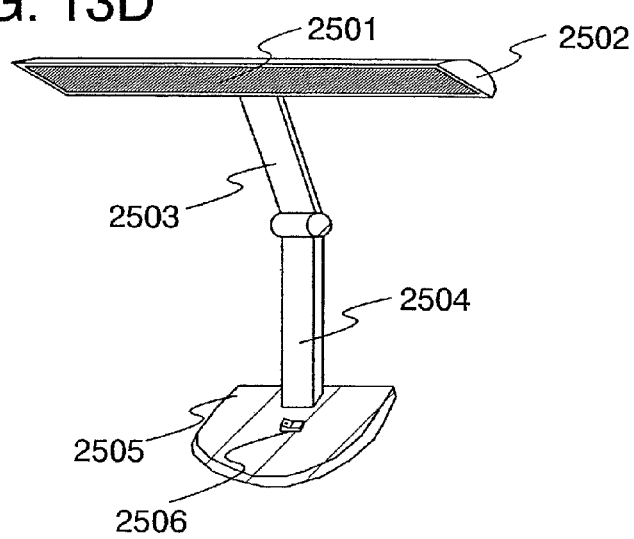

FIG. 13D shows a desk lighting appliance, which includes a lighting portion 2501, a shade 2502, an adjustable arm 2503, a support 2504, a base 2505, and a power supply 2506. The desk lighting appliance is manufactured by using a light-emitting device of the present invention for the lighting portion 2501. Note that a lighting appliance also refers to a ceiling lighting appliance, a wall-hanging appliance, and the like. When the display device described in any of the aforementioned embodiment modes is employed, mass productivity can be improved and an inexpensive desk lighting appliance can be provided.

EXAMPLE 1

In this example, results of calculation of comparison of current-voltage characteristics of the thin film transistor described in Embodiment Mode 1 with current-voltage characteristics of a thin film transistor which is a comparative example are described.

Figure 19A:
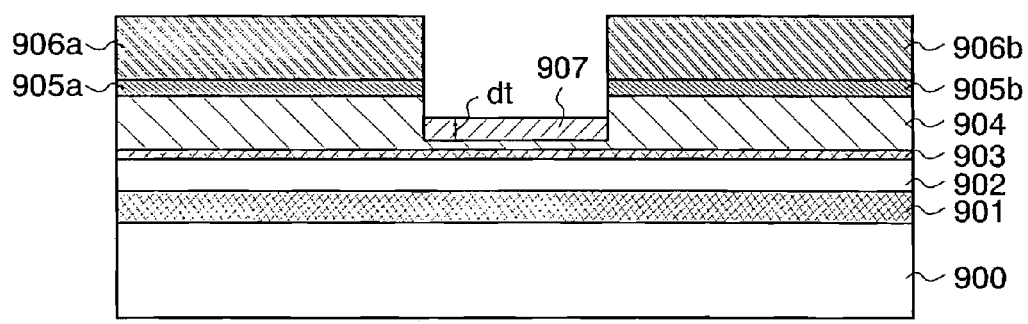
FIGS. 19A and 19B illustrate Example 1.
Figure 19B:
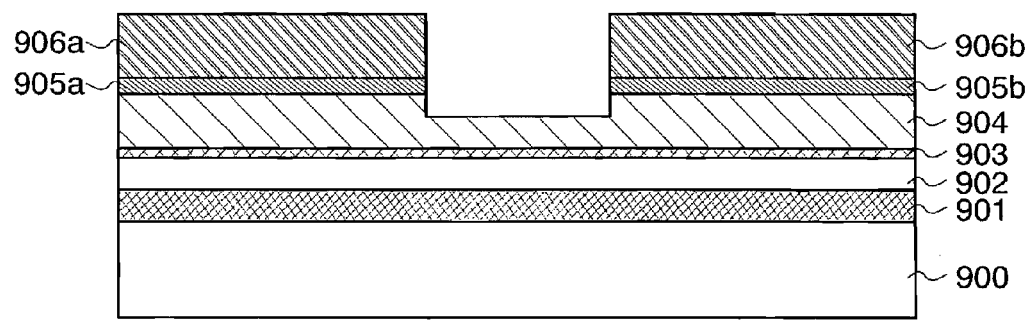

FIG. 19A shows a model diagram (this example) of the structure of the thin film transistor shown in Embodiment Mode 1. FIG. 19B shows a model diagram (the comparative example) of the structure of the thin film transistor which is the comparative example.

The structures shown in FIGS. 19A and 19B each include a gate electrode 901 which is formed of a 150-nm-thick molybdenum film, a gate insulating film 902 which is formed of a 300-nm-thick silicon nitride film, a first semiconductor layer 903 which is formed of a 10-nm-thick microcrystalline silicon film, a second semiconductor layer 904 which is formed of a 150-nm-thick amorphous silicon film, a source region 905a and a drain region 905b which are formed of an amorphous silicon film into which an impurity is introduced, and a source electrode 906a and a drain electrode 906b, over a substrate 900. In addition, in the second semiconductor layer 904, a hollow is formed between the source region 905a and the drain region 905b. The thickness of the second semiconductor layer 904 in the hollow is 100 nm.

Further, in FIG. 19A, the second semiconductor layer 904 includes an impurity region 907 between the source region 905a and the drain region 905b. That is, FIG. 19A has a structure in which the impurity region 907 is added to the structure of FIG. 19B.

Here, calculation was performed under conditions that the width (the length in a direction parallel to a source-drain direction) of the impurity region 907 is 10 μm and the width in a depth direction of the impurity region 907 (the depth (dt) where the impurity region 907 is formed from the top surface of the second semiconductor layer 904) is set to a plurality of widths (30 nm, 50 nm, 70 nm, and 90 nm). In addition, boron was contained at a concentration of $5 \times 10^{17}/cm^3$ in the impurity region 907.

In this example, calculation for the structures of FIGS. 19A and 19B was performed using the simulator "ATLAS" made by Silvaco Data Systems Inc.

Parameter of the amorphous silicon film which forms the second semiconductor layer 904 was set to the following values.

The state density of an acceptor-type defect level (tail distribution) at an end of a conduction band was nta=3.0E21 [/cm³eV]; the state density of a donor-type defect level (tail distribution) at an end of a valence band was ntd=4.0E20 [/cm³eV]; the attenuation coefficient of the state density of the acceptor-type defect level (tail distribution) was wta=0.025 [eV]; the attenuation coefficient of the state density of the donor-type defect level (tail distribution) was wtd=0.05 [eV]; the state density of the acceptor-type defect level (bump distribution) at a peak position was nga=5.0E17 [/cm³eV]; the state density of the donor-type defect level (bump distribution) at a peak position was ngd=5.0E17 [/cm³eV]; the peak position of the acceptor-type defect level (bump distribution) was ega=0.28 [eV]; the peak position of the donor-type defect level (bump distribution) was egd=0.79 [eV]; the attenuation coefficient of the state density of the acceptor-type defect level (bump distribution) was wga=0.1 [eV]; the attenuation coefficient of the state density of the donor-type defect level (bump distribution) was wgd=0.2 [eV]; the capture cross section of electrons in the base of the acceptor level was sigtae=3.0E–15 cm²; the capture cross section of holes in the base of the acceptor level was sigtah=3.0E–13 cm²; the capture cross section of electrons in the base of the donor level was sigtde=3.0E–13 cm²; the capture cross section of holes in the base of the donor level was sigtdh=3.0E–15 cm²; the capture cross section of electrons in a Gaussian distribution of an acceptor was siggae=3.0E–15 cm²; the capture cross section of holes in the Gaussian distribution of the acceptor was siggah=3.0E–13 cm²; the capture cross section of electrons in the Gaussian distribution of a donor was siggde=3.0E–13 cm²; and the capture cross section of holes in the Gaussian distribution of the donor was siggdh=3.0E–15 cm².

In addition, parameter of the microcrystalline silicon film which forms the first semiconductor layer 903 was set to the following values. Note that the defect density of the microcrystalline silicon film was a tenth of that of the amorphous silicon film.

The state density of an acceptor-type defect level (tail distribution) at an end of a conduction band was nta=2.0E21 [/cm³eV]; the state density of a donor-type defect level (tail distribution) at an end of a valence band was ntd=4.0E19 [/cm³eV]; the state density of the acceptor-type defect level (bump distribution) at a peak position was nga=9.0E17 [/cm³eV]; and the state density of the donor-type defect level (bump distribution) at a peak position was ngd=5.0E17 [/cm³eV]. Other parameters were the same as those of the amorphous silicon film.

Figure 20:
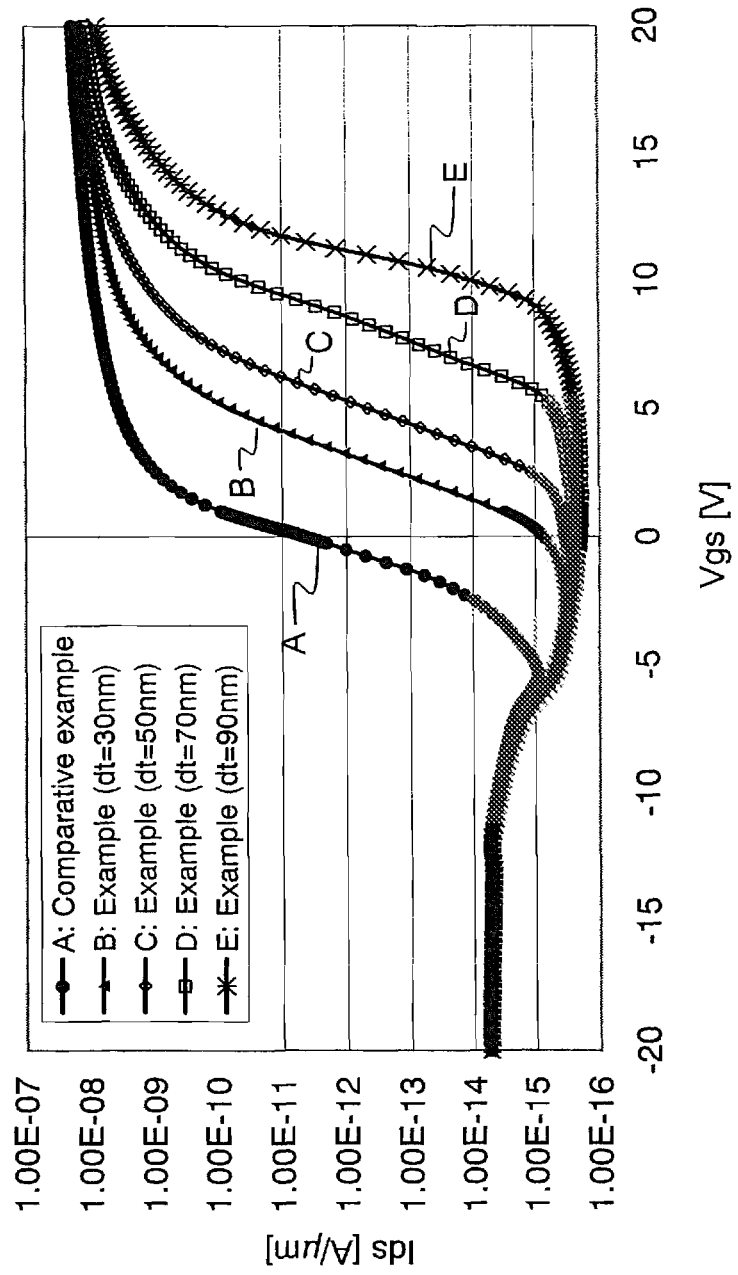
FIG. 20 illustrates current-voltage characteristics of a structure of the present invention and a comparative example.

FIG. 20 shows results of calculation for current-voltage characteristics of thin film transistors. Here, Vds=1 V. Note that in FIG. 20, the vertical axis represents source-drain current Ids [A/μm] and the horizontal axis represents a potential difference between a gate and a source Vgs [V].

As shown in FIG. 20, in the case of providing the impurity region 907, it was confirmed that off current is reduced in each this example compared to the comparative example (the case where the impurity region 907 is not provided), regardless of the depth of the impurity region 907 (dt: 30 nm, 50 nm, 70 nm, and 90 nm). Further, although it was confirmed that the threshold voltage is shifted in a positive direction as the depth (dt) of the impurity region 907 is deeper, it was confirmed that on current in the case of applying voltage higher than the threshold voltage by 5V, for example, is equal to that of the comparative example.

According to the results, when the impurity region 907 is provided, off current can be reduced compared to the structure where the impurity region 907 is not provided (FIG. 19B).

This application is based on Japanese Patent Application serial no. 2007-205694 filed with Japan Patent Office on Aug. 7, 2007, the entire contents of which are hereby incorporated by reference.

What is claimed is:

1. A thin film transistor comprising:
a gate electrode;
a gate insulating film provided over the gate electrode;
a first semiconductor layer provided over the gate insulating film and having a microcrystalline semiconductor; and
a second semiconductor layer provided over the first semiconductor layer and having an amorphous semiconductor, the second semiconductor layer including an impurity region between a source region and a drain region provided over the second semiconductor layer, the source region and the drain region having a conductivity type different from a conductivity type of the impurity region,
wherein the impurity region extends from a top surface of the second semiconductor layer towards the gate insulating film.

2. The thin film transistor according to claim 1, wherein the second semiconductor layer includes a depressed portion between the source region and the drain region.

3. The thin film transistor according to claim 1, wherein a thickness of the first semiconductor layer is smaller than a thickness of the second semiconductor layer.

4. The thin film transistor according to claim 1,
wherein the conductivity type of the source region and the drain region is an n-type conductivity, and
wherein the conductivity type of the impurity region is a p-type conductivity.

5. The thin film transistor according to claim 1,
wherein the microcrystalline semiconductor is microcrystalline silicon, and
wherein the amorphous semiconductor is amorphous silicon.

6. The thin film transistor according to claim 1, further comprising:
a protective layer provided over the second semiconductor layer, partly interposed between the second semiconductor layer and each of the source region and the drain region, and being in contact with the impurity region of the second semiconductor layer.

7. The thin film transistor according to claim 1, further comprising a source electrode in contact with the source region,
wherein an area of the source region which overlaps with the second semiconductor layer is larger than an area of the source electrode which overlaps with the second semiconductor layer.

8. The thin film transistor according to claim 1, further comprising:
a third semiconductor layer provided between the second semiconductor layer and one of the source region and the drain region.

9. A method for manufacturing a thin film transistor, comprising the steps of:
forming a gate electrode over a substrate;
forming a gate insulating film over the gate electrode;
forming a first semiconductor layer having a microcrystalline semiconductor over the gate insulating film;
forming a second semiconductor layer having an amorphous semiconductor over the first semiconductor layer;
forming a third semiconductor layer to which a first impurity element imparting a first conductivity type is added over the second semiconductor layer;
forming a conductive film over the third semiconductor layer;
selectively forming a mask over the conductive film;
forming a source electrode and a drain electrode by etching the conductive film using the mask;
forming a source region and a drain region by etching the third semiconductor layer using the mask;
forming an impurity region in the second semiconductor layer between the source region and the drain region by introducing a second impurity element having a second conductivity type different from the first conductivity type of the source region and the drain region; and
forming a second insulating film over the source electrode, the drain electrode, the source region, the drain region, the second semiconductor layer and the gate insulating film,
wherein the impurity region extends from a top surface of the second semiconductor layer towards the gate insulating film.

10. The method for manufacturing a thin film transistor according to claim 9, wherein the second impurity element is introduced using the mask as a mask.

11. The method for manufacturing a thin film transistor according to claim 9, wherein the second impurity element is introduced using the source electrode and the drain electrode as a mask.

12. The method for manufacturing a thin film transistor according to claim 9, wherein a thickness of the first semiconductor layer is smaller than a thickness of the second semiconductor layer.

13. The method for manufacturing a thin film transistor according to claim 9,
wherein the first conductivity type is an n-type conductivity, and
wherein the second conductivity type is a p-type conductivity.

14. The method for manufacturing a thin film transistor according to claim 9,
wherein the microcrystalline semiconductor is microcrystalline silicon, and
wherein the amorphous semiconductor is amorphous silicon.

15. The method for manufacturing a thin film transistor according to claim 9, further comprising;
forming a protective layer over the second semiconductor layer before forming the third semiconductor layer.

16. A method for manufacturing a display device, comprising the steps of:
forming a gate electrode over a substrate;
forming a first insulating film over the gate electrode;
forming a first semiconductor layer having a microcrystalline semiconductor over the first insulating film;
forming a second semiconductor layer having an amorphous semiconductor over the first semiconductor layer;
forming a third semiconductor layer to which a first impurity element imparting a first conductivity type is added over the second semiconductor layer;
forming a conductive film over the third semiconductor layer;
selectively forming a mask over the conductive film;
forming a source electrode and a drain electrode by etching the conductive film using the mask;
forming a source region and a drain region by etching the third semiconductor layer using the mask;

forming an impurity region in the second semiconductor layer between the source region and the drain region by introducing a second impurity element having a second conductivity type different from the first conductivity type of the source region and the drain region;

forming a second insulating film over the source electrode, the drain electrode, the source region, the drain region, the second semiconductor layer and the first insulating film;

forming a contact hole in the second insulating film; and forming a pixel electrode over the second insulating film, wherein the impurity region extends from a top surface of the second semiconductor layer towards the gate insulating film.

17. The method for manufacturing a display device according to claim 16, wherein the second impurity element is introduced using the mask as a mask.

18. The method for manufacturing a display device according to claim 16, wherein the second impurity element is introduced using the source electrode and the drain electrode as a mask.

19. The method for manufacturing a display device according to claim 16, wherein a thickness of the first semiconductor layer is smaller than a thickness of the second semiconductor layer.

20. The method for manufacturing a display device according to claim 16, wherein the first conductivity type is an n-type conductivity, and wherein the second conductivity type is a p-type conductivity.

21. The method for manufacturing a display device according to claim 16, wherein the microcrystalline semiconductor is microcrystalline silicon, and wherein the amorphous semiconductor is amorphous silicon.

22. The method for manufacturing a display device according to claim 16, further comprising:

forming a protective layer over the second semiconductor layer before forming the third semiconductor layer.

23. The method for manufacturing a display device according to claim 16, wherein the display device is a liquid crystal display device.

24. The method for manufacturing a display device according to claim 16, wherein the display device is a light-emitting display device.

* * * * *